US009529055B2

(12) United States Patent
Sakai

(10) Patent No.: US 9,529,055 B2
(45) Date of Patent: Dec. 27, 2016

(54) IMPEDANCE MEASURING DEVICE FOR LAMINATED BATTERY

(71) Applicant: NISSAN MOTOR CO., LTD., Yokohama-shi, Kanagawa (JP)

(72) Inventor: Masanobu Sakai, Yokohama (JP)

(73) Assignee: NISSAN MOTOR CO., LTD., Yokohama-Shi (JP)

( * ) Notice: Subject to any disclaimer, the term of this patent is extended or adjusted under 35 U.S.C. 154(b) by 0 days.

(21) Appl. No.: 14/434,283

(22) PCT Filed: Oct. 3, 2013

(86) PCT No.: PCT/JP2013/076993
§ 371 (c)(1),
(2) Date: Apr. 8, 2015

(87) PCT Pub. No.: WO2014/057868
PCT Pub. Date: Apr. 17, 2014

(65) Prior Publication Data
US 2015/0276888 A1    Oct. 1, 2015

(30) Foreign Application Priority Data
Oct. 9, 2012   (JP) ................................. 2012-224266

(51) Int. Cl.
*G01R 31/36*     (2006.01)
*H01M 10/0585*   (2010.01)
(Continued)

(52) U.S. Cl.
CPC ............ *G01R 31/3662* (2013.01); *H01M 8/04* (2013.01); *H01M 10/0585* (2013.01);
(Continued)

(58) Field of Classification Search
CPC ................ G01R 27/02; G01R 31/3662; H01M 10/0585; H01M 10/48; H01M 8/04; H01M 8/04649
(Continued)

(56) References Cited

U.S. PATENT DOCUMENTS 8,889,309 B2    11/2014  Manabe et al.
2009/0226770 A1*  9/2009  Manabe ............ H01M 8/04567
                                                       429/431

(Continued)

FOREIGN PATENT DOCUMENTS

CN       101218704 A     7/2008
JP        8-88941 A      4/1996
(Continued)

*Primary Examiner* — Nathaniel Pelton
(74) *Attorney, Agent, or Firm* — Foley & Lardner LLP

(57) ABSTRACT

An impedance measuring device for outputs an alternating current to an impedance measurement object, the impedance measurement object including at least a laminated battery and computes an impedance of the laminated battery on the basis of an alternating current applied to the impedance measurement object and at least one of a positive-electrode side AC potential difference and a negative-electrode side AC potential difference. This device includes a filter configured to remove a signal with a frequency of an AC signal to the AC signal, the AC signal indicating the AC potential difference on one electrode side opposite to that of the AC potential difference used by impedance computation, and an adding unit configured to add a filtered signal to the AC signal, the filtered signal being a signal after passing through the filter, the AC signal indicating the AC potential difference used by impedance computation.

3 Claims, 20 Drawing Sheets

(51) Int. Cl.
*H01M 8/04* (2016.01)
*H01M 10/48* (2006.01)
*G01R 27/02* (2006.01)

(52) U.S. Cl.
CPC ......... *G01R 27/02* (2013.01); *H01M 8/04649* (2013.01); *H01M 10/48* (2013.01)

(58) Field of Classification Search
USPC ........................................................ 324/430
See application file for complete search history.

(56) References Cited

U.S. PATENT DOCUMENTS

2011/0291613 A1* 12/2011 Rosik ................. H01M 10/443
  320/108
2013/0249562 A1* 9/2013 Sakai ................. G01R 31/3662
  324/430

FOREIGN PATENT DOCUMENTS

| JP | 2009-109375 A | 5/2009 |
| JP | 2010-38787 A | 2/2010 |
| JP | 2012-156920 A | 8/2012 |
| WO | WO 2012/077450 A1 | 6/2012 |
| WO | WO2012077450 * | 6/2012 |

* cited by examiner

IMPEDANCE MEASURING DEVICE FOR LAMINATED BATTERY

TECHNICAL FIELD

The present invention relates to a device for measuring an impedance of a laminated battery.

BACKGROUND ART

In a laminated battery in which a plurality of power generation elements are laminated, it is desirable to detect an impedance as accurately as possible. A device for measuring an impedance of a laminated battery is disclosed in JP2009-109375A. In the device described in JP2009-109375A, an impedance of a battery is measured by applying an alternating current to the battery connected to an external load.

SUMMARY OF INVENTION

However, since noise is superimposed on an alternating current to be detected in the device described in JP2009-109375A, there has been a problem that the impedance of the laminated battery cannot be accurately detected. Since it is desired to measure an alternating-current voltage signal in response to an applied alternating current signal, a filter for allowing the passage of an alternating-current voltage signal to be detected is generally used as a countermeasure against noise for these signals.

The present invention aims to provide a device capable of measuring an impedance with high accuracy by a method different from the above general filtering process.

In one aspect of an impedance measuring device for a laminated battery according to the present embodiment, the impedance measuring device is configured to output an alternating current to an impedance measurement object, the impedance measurement object including at least a laminated battery. The impedance measuring device is configured to compute an impedance of the laminated battery on the basis of an alternating current applied to the impedance measurement object and at least one of a positive-electrode side AC potential difference and the negative-electrode side AC potential difference, the positive-electrode side AC potential difference being a potential difference between a potential on a positive electrode side and an intermediate potential of the impedance measurement object, the negative-electrode side AC potential difference being a potential difference between a potential on a negative electrode side and the intermediate potential of the impedance measurement object. This impedance measuring device includes a filter configured to remove a signal with a frequency of an AC signal from the AC signal, the AC signal indicating the AC potential difference on one electrode side opposite to that of the AC potential difference used by impedance computation from the AC signal, and an adding unit configured to add a filtered signal to the AC signal, the filtered signal being a signal after passing through the filter, the AC signal indicating the AC potential difference used by impedance computation.

DESCRIPTION OF EMBODIMENTS

Hereinafter, embodiments of the present invention are described with reference to the accompanying drawings.

First Embodiment

Figure 1A:
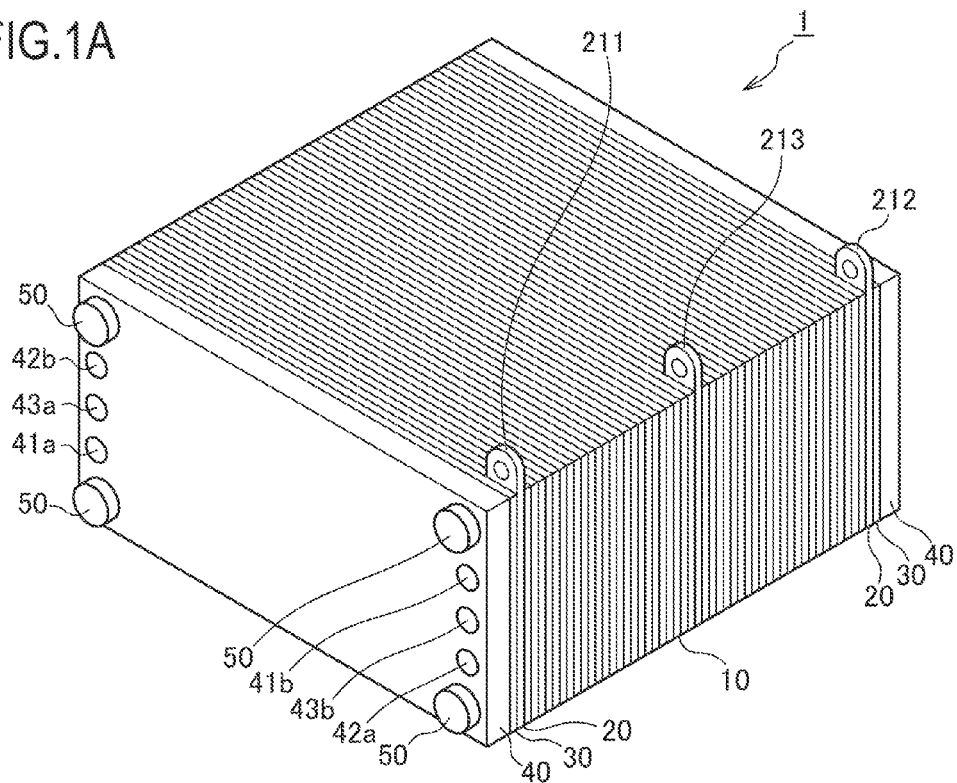
FIG. 1A is an external perspective view showing a fuel battery as an example of a laminated battery to which an impedance measuring device according to the present invention is applied.
Figure 1B:
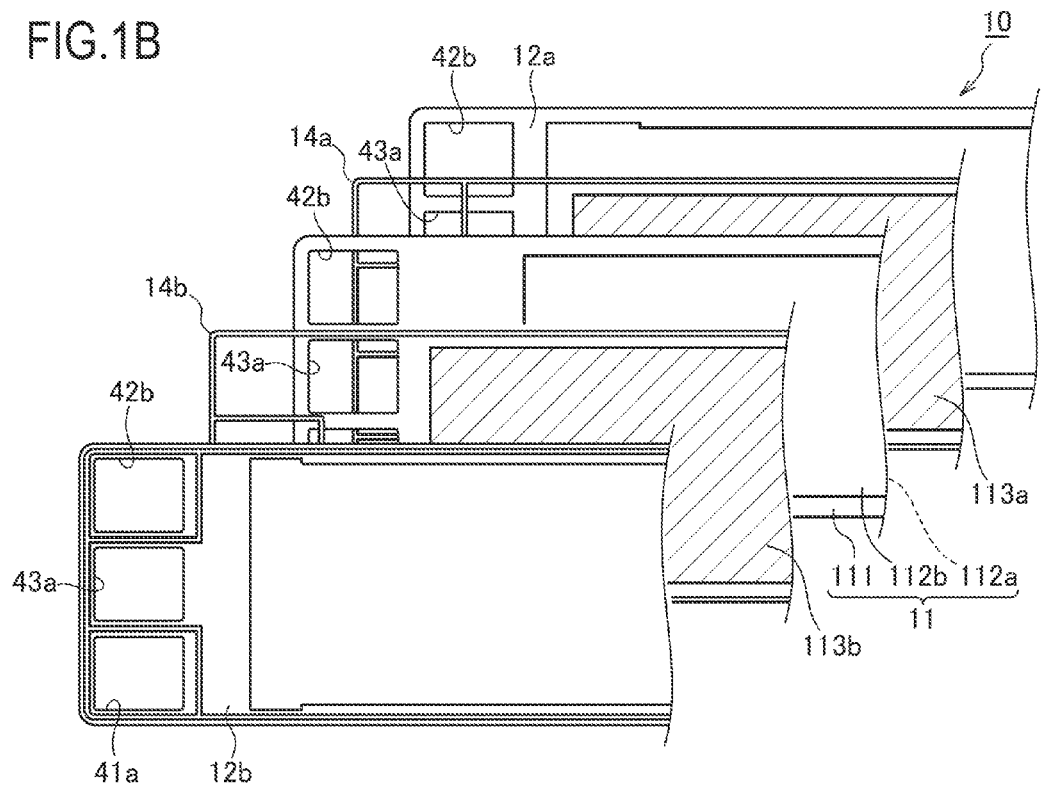
FIG. 1B is an exploded view showing the structure of a power generation cell constituting the fuel battery shown in FIG. 1A.

FIGS. 1A and 1B are diagrams showing a fuel battery as an example of a laminated battery to which an impedance measuring device according to the present invention is applied, wherein FIG. 1A is an external perspective view and FIG. 1B is an exploded view showing the structure of a power generation cell.

As shown in FIG. 1A, a fuel cell stack 1 includes a plurality of laminated power generation cells 10, current collector plates 20, insulation plates 30, end plates 40 and four tension rods 50.

The power generation cell 10 is a unit cell of the fuel battery. Each power generation cell 10 generates an electromotive voltage of about 1 volt (V). The detailed configuration of each power generation cell 10 is described in detail later.

The current collector plates 20 are respectively arranged at outer sides of the plurality of laminated power generation cells 10. The current collector plates 20 are formed of a gas-impermeable conductive material such as dense carbon. The current collector plate 20 includes a positive electrode terminal 211 and a negative electrode terminal 212. Further, an intermediate terminal 213 is provided between the positive electrode terminal 211 and the negative electrode terminal 212. The fuel cell stack 1 extracts and outputs electrons e⁻ generated in each power generation cell 10 by the positive electrode terminals 211 and the negative electrode terminals 212.

The insulation plates 30 are respectively arranged at outer sides of the current collector plates 20. The insulation plates 30 are formed of an insulating material such as rubber.

The end plates 40 are respectively arranged at outer sides of the insulation plates 30. The end plates 40 are formed of a rigid metal material such as steel.

One end plate 40 (end plate 40 on a front left side in FIG. 1A) includes an anode supply port 41a, an anode discharge port 41b, a cathode supply port 42a, a cathode discharge port 42b, a cooling water supply port 43a and a cooling water discharge port 43b. In the present embodiment, the anode discharge port 41b, the cooling water discharge port 43b and the cathode supply port 42a are provided on a right side in FIG. 1A. Further, the cathode discharge port 42b, the cooling water supply port 43a and the anode supply port 41a are provided on a left side in FIG. 1A.

The tension rods 50 are respectively arranged near four corners of the end plate 40. The fuel cell stack 1 is formed with holes (not shown) penetrating inside. The tension rods 50 are inserted into these through holes. The tension rods 50 are formed of a rigid metal material such as steel. Insulation processing is applied to surfaces of the tension rods 50 to prevent an electrical short circuit between the power generation cells 10. Nuts (not shown by being located on a back side) are threadably engaged with these tension rods 50. The tension rods 50 and the nuts tighten the fuel cell stack 1 in a lamination direction.

A method for supplying hydrogen as anode gas to the anode supply port 41a is, for example, a method for directly supplying hydrogen gas from a hydrogen storage device, a method for supplying hydrogen-containing gas obtained by reforming hydrogen-containing fuel or the like. It should be noted that the hydrogen storage device is a high-pressure gas tank, a liquefied hydrogen tank, a hydrogen storage alloy tank or the like. The hydrogen-containing fuel is natural gas, methanol, gasoline or the like. Further, air is generally used as cathode gas to be supplied to the cathode supply port 42a.

As shown in FIG. 1B, the power generation cell 10 is so structured that an anode separator (anode bipolar plate) 12a and a cathode separator (cathode bipolar plate) 12b are arranged on opposite surfaces of a membrane electrode assembly (MEA) 11.

In the MEA 11, electrode catalyst layers 112 are formed on opposite surfaces of an electrolyte membrane 111 composed of an ion-exchange membrane. Gas diffusion layers (GDL) 113 are formed on these electrode catalyst layers 112.

The electrode catalyst layer 112 is, for example, formed of platinum-carrying carbon black particles.

The GDL 113 is, for example, formed of a material having sufficient gas diffusion property and electrical conductivity such as carbon fibers.

The anode gas supplied from the anode supply port 41a flows in this GDL 113a, reacts with the anode electrode catalyst layer 112 (112a) and is discharged from the anode discharge port 41b.

The cathode gas supplied from the cathode supply port 42a flows in this GDL 113b, reacts with the cathode electrode catalyst layer 112 (112b) and is discharged from the cathode discharge port 42b.

The anode separator 12a is laid on one surface (back surface in FIG. 1B) of the MEA 11 via the GDL 113a and a seal 14a. The cathode separator 12b is laid on one surface (front surface in FIG. 1B) of the MEA 11 via the GDL 113b and a seal 14b. The seals 14 (14a, 14b) are rubber-like elastic members made of, for example, silicone rubber, ethylene propylene diene monomer (EPDM), fluororubber or the like. The anode separator 12a and the cathode separator 12b are, for example, formed by press-molding a separator base made of metal such as stainless steel, forming reaction gas flow passages on one surface and forming cooling water flow passages on an opposite surface such that the reaction gas flow passages and the cooling water flow passages are alternately arranged. As shown in FIG. 1B, the anode separator 12a and the cathode separator 12b are laid together to form the cooling water flow passages.

Each of the MEA 11, the anode separator 12a and the cathode separator 12b are formed with holes 41a, 41b, 42a, 42b, 43a and 43b and, by laying these one next to each other, the anode supply port (anode supply manifold) 41a, the anode discharge port (anode discharge manifold) 41b, the cathode supply port (cathode supply manifold) 42a, the cathode discharge port (cathode discharge manifold) 42b, the cooling water supply port (cooling water supply manifold) 43a and the cooling water discharge port (cooling water discharge manifold) 43b are formed.

Figure 2:
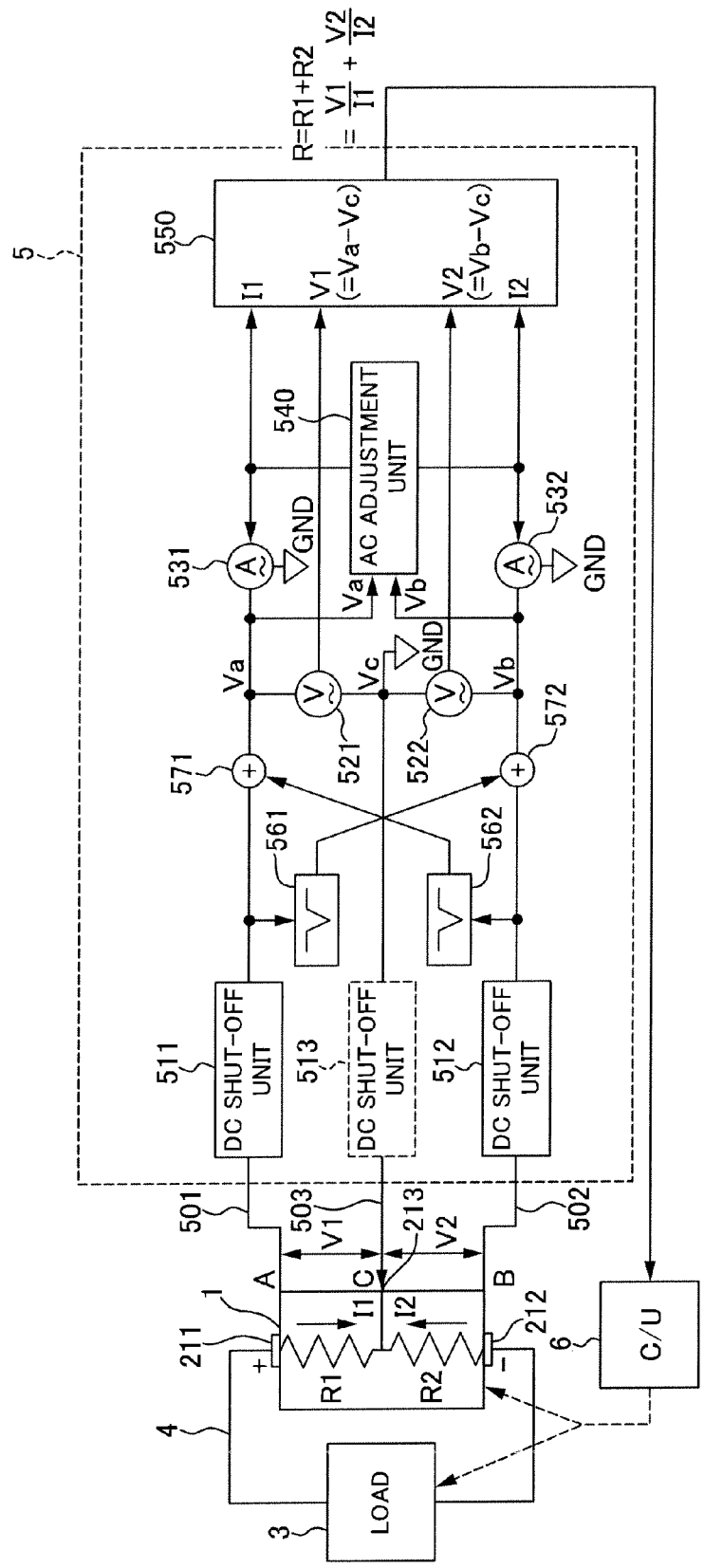
FIG. 2 is a circuit diagram of an impedance measuring device for a laminated battery in a first embodiment.

FIG. 2 is a circuit diagram of an impedance measuring device for a laminated battery in a first embodiment.

An impedance measuring device 5 includes a positive-electrode side direct current shut-off unit 511, a negative-electrode side direct current shut-off unit 512, an intermediate point direct current shut-off unit 513, a positive-electrode side AC potential difference detecting unit 521, a negative-electrode side AC potential difference detecting unit 522, a positive-electrode side power supply unit 531, a negative-electrode side power supply unit 532, an AC adjustment unit 540, an impedance computing unit 550, a positive-electrode side notch filter 561, a negative-electrode side notch filter 562, a positive-electrode side adder 571 and a negative-electrode side adder 572.

Figure 3:
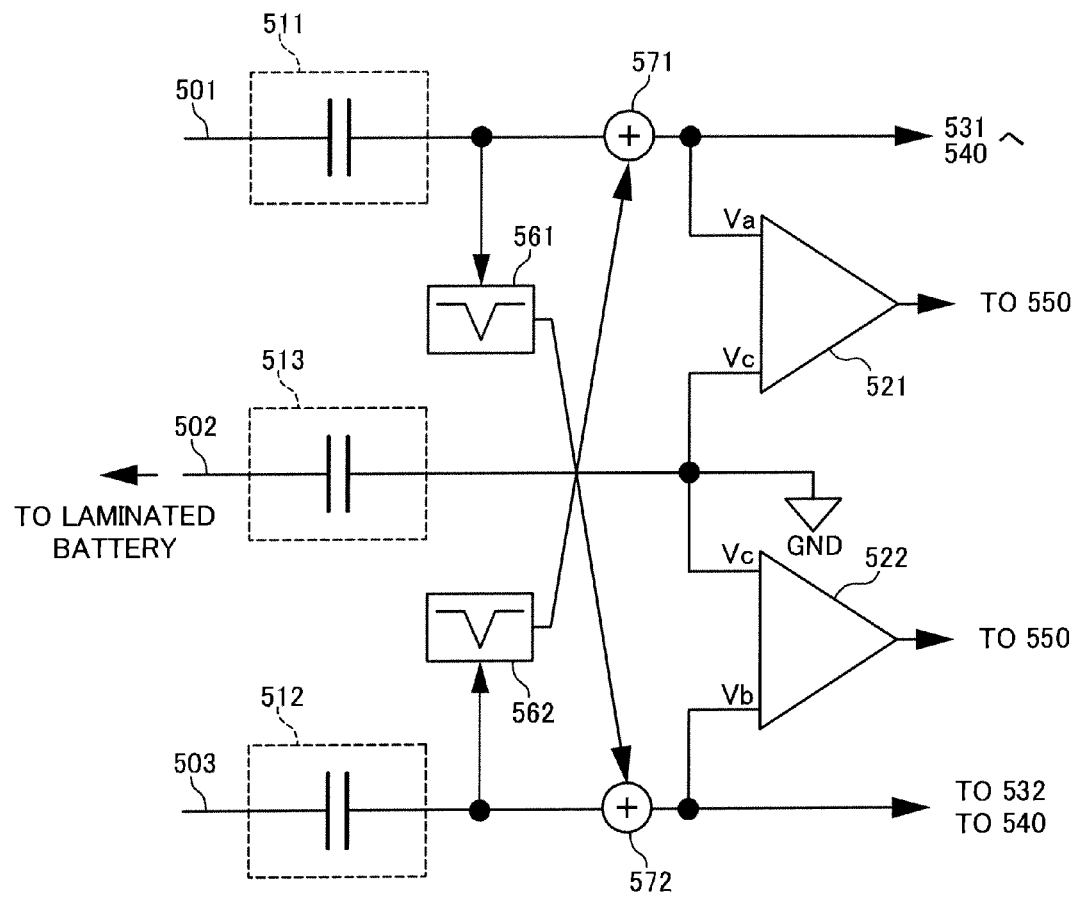
FIG. 3 is a diagram showing a positive-electrode side direct current shut-off unit 511, a negative-electrode side direct current shut-off unit 512, an intermediate point direct current shut-off unit 513, a positive-electrode side AC potential difference detecting unit 521, a negative-electrode side AC potential difference detecting unit 522, a positive-electrode side notch filter 561, a negative-electrode side notch filter 562 and adders 571, 572 in detail.

The positive-electrode side direct current shut-off unit 511, the negative-electrode side direct current shut-off unit 512, the intermediate point direct current shut-off unit 513, the positive-electrode side AC potential difference detecting unit 521, the negative-electrode side AC potential difference detecting unit 522, the positive-electrode side notch filter 561, the negative-electrode side notch filter 562, the positive-electrode side adder 571 and the negative-electrode side adder 572 are described in detail with reference to FIG. 3.

The positive-electrode side direct current shut-off unit 511 is connected to the positive electrode terminal 211 of the fuel battery 1. The negative-electrode side direct current shut-off unit 512 is connected to the negative electrode terminal 212 of the fuel battery 1. The intermediate point direct current shut-off unit 513 is connected to the intermediate terminal 213 of the fuel battery 1. In the present embodiment, the intermediate terminal 213 is connected to a point at an intermediate potential of the fuel battery 1 and grounded. It should be noted that the intermediate point direct current shut-off unit 513 may not be provided as shown by wavy line in FIG. 2. These direct current shut-off units shut off a direct current, but allows an alternating current to flow. The direct current shut-off units are, for example, capacitors or transformers.

The positive-electrode side notch filter 561 removes an alternating current (AC) signal of a predetermined frequency (e.g. 5 KHz) to be detected by the positive-electrode side AC potential difference detecting unit 521 to be described later out of a signal whose direct current is shut off in the positive-electrode side direct current shut-off unit 511. Since the signal whose direct current is shut off in the positive-electrode side direct current shut-off unit 511 includes a noise component together with the AC signal to be detected, the signal having passed through the positive-electrode side notch filter 561 is composed only of the noise component.

The negative-electrode side notch filter 562 removes an AC signal of a predetermined frequency (e.g. 5 KHz) to be detected by the negative-electrode side AC potential difference detecting unit 522 to be described later out of a signal whose direct current is shut off in the negative-electrode side direct current shut-off unit 512. Since the signal whose direct current is shut off in the negative-electrode side direct current shut-off unit 512 includes a noise component together with the AC signal to be detected, the signal having passed through the negative-electrode side notch filter 562 is composed only of the noise component.

The positive-electrode side adder 571 adds the signal whose direct current is shut off in the positive-electrode side direct current shut-off unit 511 and the signal having passed through the negative-electrode side notch filter 562. As described above, since the intermediate point 213 is a point at an intermediate potential of the fuel battery 1 and grounded, the signal whose direct current is shut off in the negative-electrode side direct current shut-off unit 512 is a signal having a phase different from that of the signal whose direct current is shut off in the positive-electrode side direct current shut-off unit 511 by 180°. Specifically, a signal indicating the noise component having passed through the negative-electrode side notch filter 562 is a signal having a phase different from that of the noise component contained in the signal whose direct current is shut off in the positive-electrode side direct current shut-off unit 511 (inverted phase). Thus, the noise component is canceled out by adding the signal whose direct current is shut off in the positive-electrode side direct current shut-off unit 511 and the signal having passed through the negative-electrode side notch filter 562. Therefore, an output of the positive-electrode side adder 571 is an AC signal of the predetermined frequency to be detected containing no noise component.

The negative-electrode side adder 572 adds the signal whose alternating current is shut off in the negative-electrode side alternating current shut-off unit 512 and the signal having passed through the positive-electrode side notch filter 561. Also in this case, an output of the negative-electrode side adder 572 is an AC signal of the predetermined frequency to be detected containing no noise component since the noise component contained in the signal having passed through the positive-electrode side notch filter 561 and the signal of the noise component having passed through the positive-electrode side notch filter 561 are canceled out.

The positive-electrode side AC potential difference detecting unit 521 has an AC potential Va of the positive electrode terminal 211 of the fuel battery 1 and an AC potential Vc of the intermediate terminal 213 input thereto and outputs a positive-electrode side alternating current (AC) potential difference. The negative-electrode side AC potential difference detecting unit 522 has an AC potential Vb of the negative electrode terminal 212 of the fuel battery 1 and the AC potential Vc of the intermediate terminal 213 input thereto and outputs a negative-electrode side AC potential difference. The positive-electrode side AC potential difference detecting unit 521 and the negative-electrode side AC potential difference detecting unit 522 are, for example, differential amplifiers (instrumentation amplifiers).

The positive-electrode side AC potential difference detecting unit 531 and the negative-electrode side AC potential difference detecting unit 532 are described in detail with reference to FIG. 4.

Figure 4:
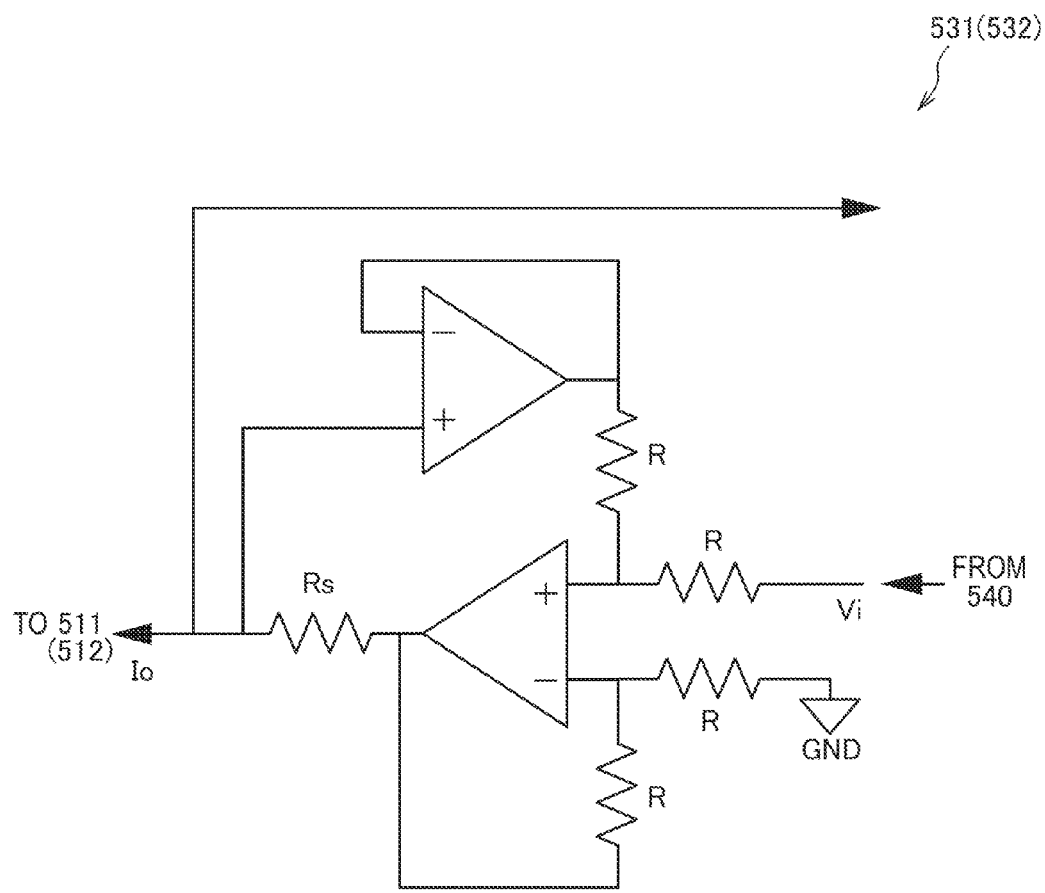
FIG. 4 is a diagram showing a positive-electrode side power supply unit 531 and a negative-electrode side power supply unit 532 in detail.

The positive-electrode side power supply unit 531 can be realized, for example, by a voltage-current conversion circuit by an operational amplifier (OP amplifier) as shown in FIG. 4. According to this circuit, a current Io in proportion to an input voltage Vi is output. It should be noted that Io=Vi/Rs and Rs denotes a current sensing resistance. Specifically, this circuit is a variable alternating current source capable of adjusting the output current Io by the input voltage Vi.

If this circuit is used, the output current Io can be computed by input voltage Vi/proportionality constant Rs even without being actually measured. Further, since the output is a current, an alternating current flowing in a laminated cell group and an output of the current source have the same phase even if an element, which causes a phase angle, such as a capacitor is disposed in a current path. Furthermore, the input voltage Vi also has the same phase. Thus, it is not necessary to consider a phase difference in impedance computation in a subsequent stage and the circuit is simple. Furthermore, there is no influence of a phase change even if an impedance of the capacitor in the current path varies. Because of these, the circuit as shown in FIG. 4 is preferably used as the positive-electrode side power supply unit 531. The same holds true for the negative-electrode side power supply unit 532.

The AC adjustment unit 540 is described in detail with reference to FIG. 5.

Figure 5:
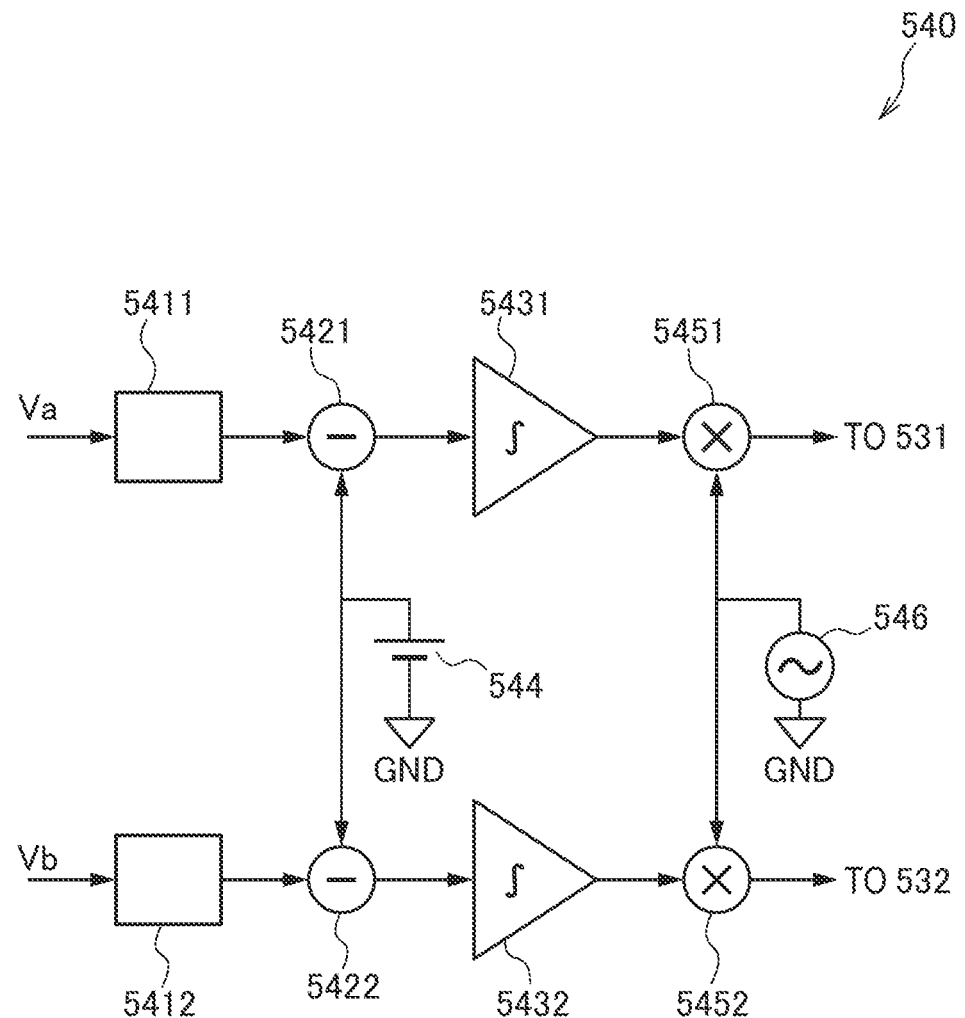
FIG. 5 is a diagram showing an alternating current adjustment unit 540 in detail.

The AC adjustment unit 540 can be realized, for example, by a PI control circuit as shown in FIG. 5. The AC adjustment unit 540 includes a positive-electrode side detector circuit 5411, a positive-electrode side subtractor 5421, a positive-electrode side integration circuit 5431, a positive-electrode side multiplier 5451, a negative-electrode side detector circuit 5412, a negative-electrode side subtractor 5422, a negative-electrode side integration circuit 5432, a negative-electrode side multiplier 5452, a reference voltage 544 and an AC signal source 546.

The positive-electrode side detector circuit 5411 removes an unnecessary signal from the AC potential Va on a wiring of the positive-electrode side power supply unit 531 connected to the positive electrode terminal 211 of the fuel battery 1 and converts the AC potential Va into a direct current signal.

The positive-electrode side subtractor 5421 detects a difference between that direct current signal and the reference voltage 544. The positive-electrode side integration circuit 5431 averages or adjusts the sensitivity of a signal output from the positive-electrode side subtractor 5421.

The positive-electrode side multiplier 5451 modulates an amplitude of the AC signal source 546 by an output of the positive-electrode side integration circuit 5431.

The AC adjustment unit 540 generates a command signal to the positive-electrode side power supply unit 531 in this way. Similarly, the AC adjustment unit 540 generates a command to the negative-electrode side power supply unit 532. By increasing and decreasing outputs of the positive-electrode side power supply unit 531 and the negative-electrode side power supply unit 532 according to the command signals generated in this way, the AC voltages Va and Vb are both controlled to a predetermined level. This causes the AC voltages Va and Vb to become equal.

It should be noted that although a circuit configuration is shown taking an analog computation IC as an example in this example, the AC voltage Va (Vb) may be generated by a digital control circuit after being converted into a digital potential by an AD converter.

Figure 6:
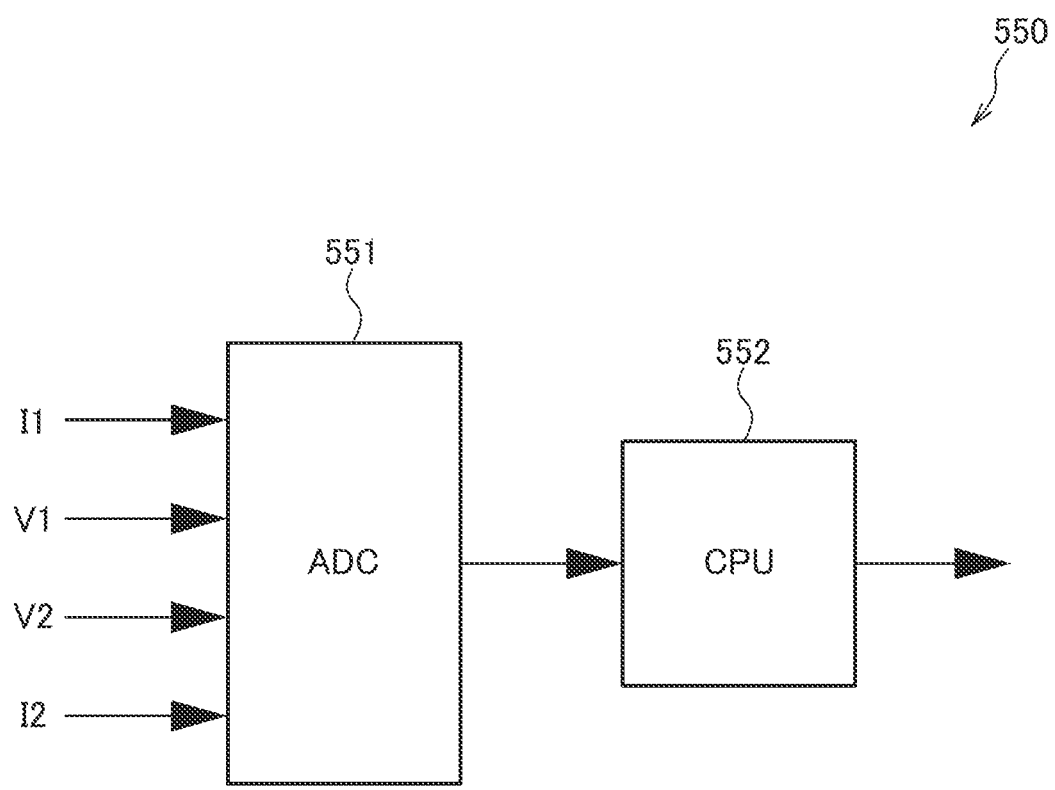
FIG. 6 is a diagram showing an impedance computing unit 550 in detail.

The impedance computing unit 550 is described in detail with reference to FIG. 6.

The impedance computing unit 550 includes an AD converter (ADC) 551 and a microcomputer chip (CUP) 552.

The AD converter 551 converts alternating currents (I1, I2) and AC voltages (V1, V2), which are analog signals, into digital numeric signals and transfers them to the microcomputer chip 552.

The microcomputer chip 552 stores a program for computing an impedance Rn and an impedance R of the entire laminated battery in advance. The microcomputer chip 552 successively computes at predetermined minute time intervals or outputs a computation result according to a request of a control unit 6. It should be noted that the impedance Rn and the impedance R of the entire laminated battery are computed by the following equations. In the present embodiment, n=2.

[Equations 1]

$$Rn = \frac{Vn}{In}(m = 1, 2, \ldots, n) \quad (1\text{-}1)$$

$$R = \sum Rn \quad (1\text{-}2)$$

The impedance computing unit 550 may be realized by an analog computation circuit using an analog computation IC. According to the analog computation circuit, a temporary continuous impedance change can be output.

Figure 7:
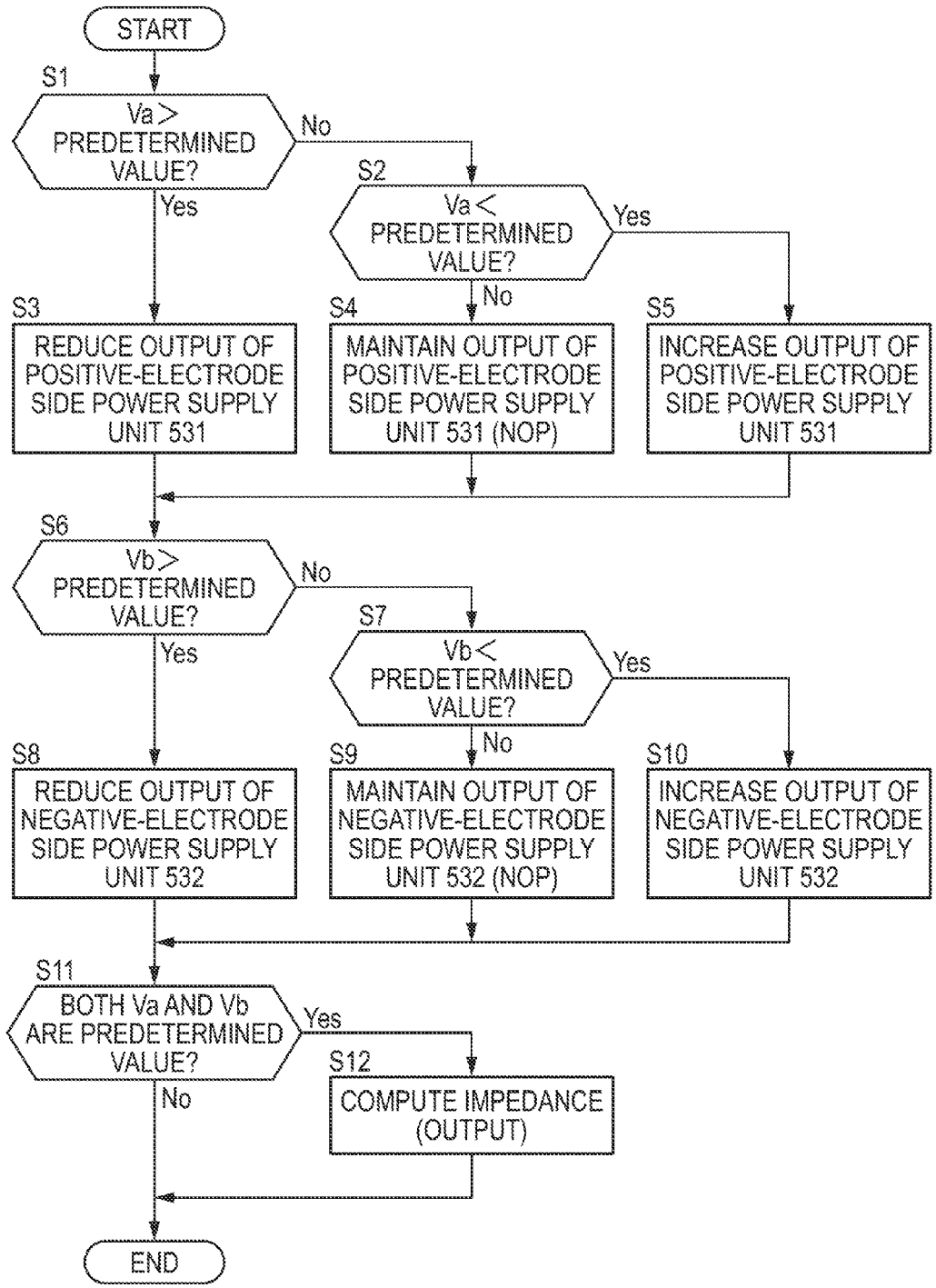
FIG. 7 is a control flow chart to be executed by a control unit 6 in the first embodiment of the impedance measuring device for a laminated battery according to the present invention.

FIG. 7 is a control flow chart to be executed by the control unit 6 in the first embodiment of the impedance measuring device for a laminated battery according to the present invention.

In Step S1, the control unit 6 determines whether or not the positive electrode AC voltage Va is larger than a predetermined value. The control unit 6 proceeds to Step S2 if a determination result is negative while proceeding to Step S3 if the determination result is affirmative.

In Step S2, the control unit 6 determines whether or not the positive electrode AC voltage Va is smaller than the predetermined value. The control unit 6 proceeds to Step S4 if a determination result is negative while proceeding to Step S5 if the determination result is affirmative.

In Step S3, the control unit 6 reduces the output of the positive-electrode side power supply unit 531. In this way, the positive electrode AC potential Va decreases.

In Step S4, the control unit 6 maintains the output of the positive-electrode side power supply unit 531. In this way, the positive electrode AC potential Va is maintained.

In Step S5, the control unit 6 increases the output of the positive-electrode side power supply unit 531. In this way, the positive electrode AC potential Va increases.

In Step S6, the control unit 6 determines whether or not the negative electrode AC voltage Vb is larger than the predetermined value. The control unit 6 proceeds to Step S7 if a determination result is negative while proceeding to Step S8 if the determination result is affirmative.

In Step S7, the control unit 6 determines whether or not the negative electrode AC voltage Vb is smaller than the predetermined value. The control unit 6 proceeds to Step S9 if a determination result is negative while proceeding to Step S10 if the determination result is affirmative.

In Step S8, the control unit 6 reduces the output of the negative-electrode side power supply unit 532. In this way, the negative electrode AC potential Vb decreases.

In Step S9, the control unit 6 maintains the output of the negative-electrode side power supply unit 532. In this way, the negative electrode AC potential Vb is maintained.

In Step S10, the control unit 6 increases the output of the negative-electrode side power supply unit 532. In this way, the negative electrode AC potential Vb increases.

In Step S11, the control unit 6 determines whether or not the positive electrode AC potential Va and the negative electrode AC potential Vb are the predetermined value. The control unit 6 proceeds to Step S12 if a determination result is affirmative while exiting from the process if the determination result is negative.

In Step S12, the control unit 6 computes the impedances in accordance with the aforementioned equations (1-1), (1-2).

Figure 8:
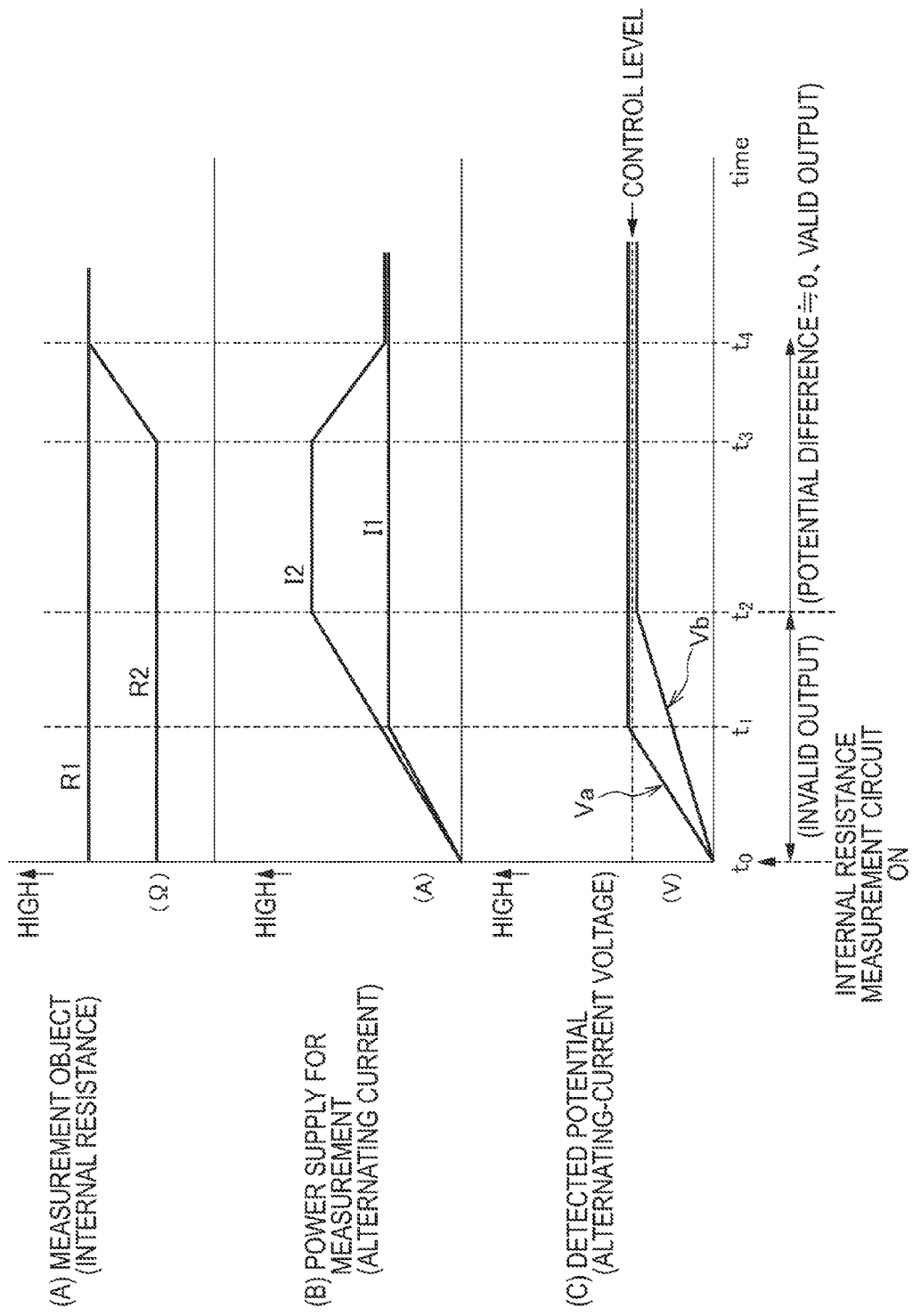
FIG. 8 is a time chart when the impedance measuring device for a laminated battery according to the present invention is controlled by a controller.

FIG. 8 are time charts when the impedance measuring device for a laminated battery according to the present invention is controlled by the controller unit 6.

It should be noted that step numbers are also written to make correspondence with the flow chart easily understandable.

In an initial stage in FIG. 8, an impedance R1 on a positive electrode side is high and an impedance R2 on a negative electrode side is low (FIG. 8(A)). The control unit 6 starts a control in such a state.

At time t0, neither the positive electrode AC potential Va nor the negative electrode AC potential Vb has reached a control level (FIG. 8C)). In this state, the control unit 6 repeats Steps S1→S2→S5→S6→S7→S10→S11. This causes the positive-electrode side alternating current I1 and the negative-electrode side alternating current I2 to increase (FIG. 8(B)).

When the positive electrode AC potential Va reaches the control level at time t1 (FIG. 8(C)), the control unit 6 repeats Steps S1→S2→S4→S6→S7→S10→S11. This causes the positive-electrode side alternating current I1 to be maintained and the negative-electrode side alternating current I2 to increase (FIG. 8(B)).

When the negative electrode AC potential Vb also reaches the control level to have the same level as the positive electrode AC potential Va at time t2 (FIG. 8(C)), the control unit 6 repeats Steps S1→S2→S4→S6→S7→S9→S11→S12. This causes the positive-electrode side alternating current I1 and the negative-electrode side alternating current I2 to be maintained (FIG. 8(B)). Then, the positive-electrode side impedance R1 and the negative-electrode side impedance R2 are computed in accordance with the equation (1-1). Then, the overall impedance R is obtained by adding the positive-electrode side impedance R1 and the negative-electrode side impedance R2.

The negative-electrode side impedance R2 increases due to a change in a wet state of the fuel battery or the like at and after time t3 (FIG. 8(A)). In this case, the control unit 6 repeats Steps S1→S2→S4→S6→S8→S11→S12. Since the negative-electrode side alternating current I2 is reduced in accordance with an increase of the negative-electrode side impedance R2 by processing in this way, the negative electrode AC potential is maintained at the same level as the positive electrode AC potential. Thus, the impedance is computed also in this state.

At and after t4, the negative-electrode side impedance coincides with the positive-electrode side impedance (FIG. 8(A)). In this case, the control unit 6 repeats Steps S1→S2→S4→S6→S7→S9→S11→S12. The positive-electrode side AC potential and the negative-electrode side AC potential are maintained (FIG. 8(C)) at the same level by processing in this way and the impedance is computed.

In the above description, the impedance R of the entire fuel battery is obtained by adding the positive-electrode side impedance R1 and the negative-electrode side impedance R2. Since the intermediate point is the point at the intermediate potential of the fuel cell, the positive-electrode side impedance R1 and the negative-electrode side impedance R2 are equal. Thus, the impedance R of the fuel cell can be obtained, for example, by obtaining the positive-electrode side impedance R1 by detecting only the positive-electrode side AC potential difference and the positive-electrode side alternating current and doubling the obtained impedance R1. In this case, it is sufficient to provide only the negative-electrode side notch filter 562 and the positive-electrode side adder (adding unit) 571 and the positive-electrode side notch filter 561 and the negative-electrode side adder 572 can be omitted. Similarly, the impedance R of the fuel cell can be obtained, for example, by obtaining the negative-electrode side impedance R2 by detecting only the negative-electrode side AC potential difference and the negative-electrode side alternating current and doubling the obtained impedance R2. In this case, it is sufficient to provide only the positive-electrode side notch filter 561 and the negative-electrode side adder 572 and the negative-electrode side notch filter 562 and the positive-electrode side adder 571 can be omitted.

As described above, the impedance measuring device for a laminated battery in the first embodiment configured to output an alternating current to the laminated battery, detect at least one of a positive-electrode side AC potential difference and a negative-electrode side AC potential difference, the positive-electrode side AC potential difference being a potential difference between a potential on the positive electrode side of the laminated battery and an intermediate potential of the laminated battery, the negative-electrode side AC potential difference is a potential difference between a potential on the negative electrode side of the laminated battery and the inter mediate potential of the laminated battery, and compute the impedance of the laminated battery on the basis of at least one AC potential difference and the alternating current applied to the laminated battery. This impedance measuring device for laminated battery includes the filter corresponding to the detected AC potential difference out of the positive-electrode side notch filter 561 configured to remove a signal component with a frequency of the AC signal frequency indicating the positive-electrode side AC potential difference from the AC signal and the negative-electrode side notch filter 562 configured to remove a signal component with a frequency of the AC signal indicating the negative-electrode side AC potential difference from the AC signal, and the adder configured to add a signal having passed through the filter corresponding to the detected AC potential difference out of the positive-electrode side adder 571 configured to add a signal having passed through the first filter 561 to the AC signal indicating the negative-electrode side potential difference and the negative-electrode side adder 572 configured to add a signal having passed through the negative-electrode side notch filter 562 to the AC signal indicating the positive-electrode side potential difference. The signal obtained by removing the signal of the AC signal frequency from the AC signal indicating the positive-electrode side AC potential difference by the positive-electrode side notch filter 561 is a noise signal. Since the signal indicating the positive-electrode side AC potential difference and the signal indicating the negative-electrode side AC potential difference from the intermediate potential of the laminated battery as a reference are signals having phases different by 180° (inverted phases), the noise signal can be canceled out and the AC signal free from noise and indicating the negative-electrode side AC potential difference can be extracted by adding the signal having passed through the positive-electrode side notch filter 561 to the AC signal indicating the negative-electrode side AC potential difference. Similarly, the noise signal can be canceled out and the AC signal free from noise and indicating the positive-electrode side AC potential difference can be extracted by adding the signal having passed through the negative-electrode side notch filter 562 to the AC signal indicating the positive-electrode side AC potential difference. In this way, the impedance of the laminated battery can be accurately obtained based on the AC potential differences free from the influence of noise and the alternating current.

In the case of removing a noise component using a band-pass filter for allowing signals in a predetermined frequency band to pass, cost increases since the band-pass filter for allowing signals in a narrow frequency range is expensive. However, in the present embodiment, noise can be removed at reduced cost by using inexpensive notch filters as compared with the configuration using the band-pass filter.

Further, in an active noise control system for removing a noise signal by adding a signal obtained by inverting the phase of a noise signal desired to be removed to a source signal, the noise signal desired to be removed needs to be generated. However, in the present embodiment, the noise component can be removed from the AC signal indicating the negative-electrode side AC potential difference only by adding the AC signal indicating the positive-electrode side AC potential difference and having passed through the positive-electrode side notch filter 561 to the AC signal indicating the negative-electrode side AC potential difference. Similarly, the noise component can be removed from the AC signal indicating the positive-electrode side AC potential difference only by adding the AC signal indicating the negative-electrode side AC potential difference and having passed through the negative-electrode side notch filter 562 to the AC signal indicating the positive-electrode side AC potential difference.

Second Embodiment

Figure 9A:
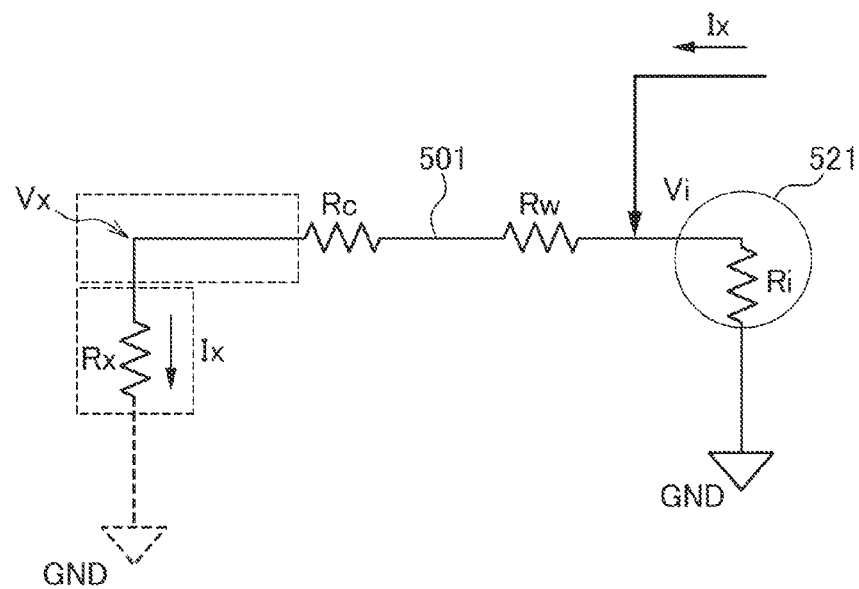
FIGS. 9A and 9B are diagrams showing functions and effects of an impedance measuring device for a laminated battery in a second embodiment.
Figure 9B:
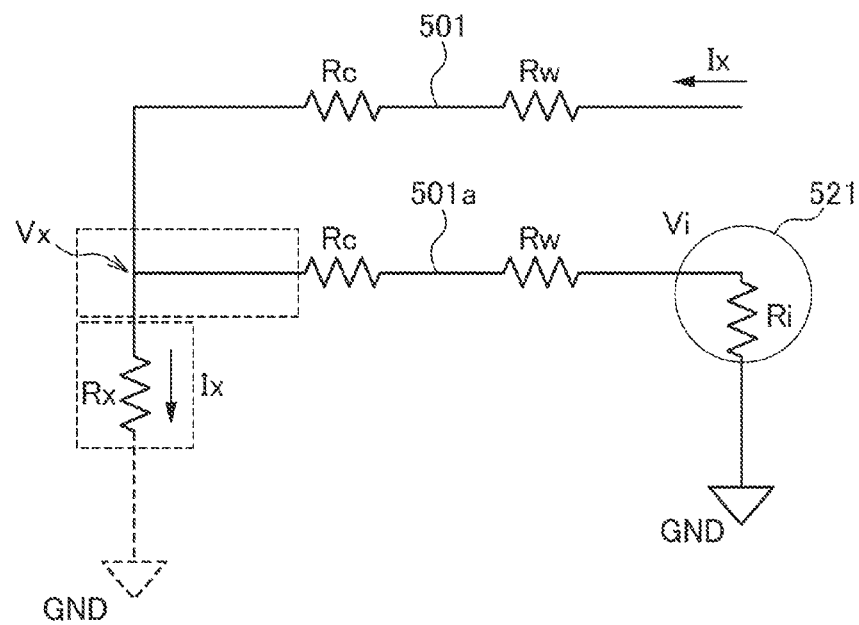

FIGS. 9A and 9B are diagrams showing functions and effects of an impedance measuring device for a laminated battery in a second embodiment.

Although the AC potential difference detecting units 521, 522 and the power supply units 531, 532 are connected to the fuel battery 1 by one path in the first embodiment, they are connected to the fuel battery 1 by different paths in the present embodiment. By this, impedance detection accuracy is improved. The reason for that is described below.

If an AC potential difference detecting unit and a power supply unit are connected by one path as shown in FIG. 9A, a potential Vx of the fuel battery 1 is expressed by the following equation (2).

[Equation 2]

$$Vx = Rx \times Ix \quad (2)$$

Contrary to this, a voltage Vi detected by the AC potential difference detecting unit 521 is expressed by the following equation (3).

[Equation 3]

$$Vi = Vx + (Rc + Rw) \times Ix \quad (3)$$

In this way, the voltage Vi detected by the AC potential difference detecting unit 521 is obtained by adding an error voltage corresponding to a wiring resistance Rw, a contact resistance Rc at a connection point and an alternating current to the potential Vx originally desired to be detected. Thus, a measurement error err is expressed by the following equation (4).

[Equation 4]

$$err = \frac{Vi}{Vx} = \frac{Rx + Rc + Rw}{Rx} \quad (4)$$

Since a measurement object resistance Rx is generally high such as in a small-size battery, the contact resistance Rc and the wiring resistance Rw can be ignored and there is practically no problem. However, in a large-size battery, a relationship of [wiring resistance Rw>measurement object resistance Rx] generally holds. In this case, connection to each laminated cell group by a four-terminal method is necessary.

Accordingly, in the present embodiment, the AC potential difference detecting unit and the power supply unit are respectively connected by different paths as shown in FIG. 9(B). If this configuration is adopted, the contact resistance Rc and the wiring resistance Rw on an AC voltage detection line 501a act to divide the voltage Vx desired to be detected by an input resistance Ri of the AC potential difference detecting unit 521. Generally, the input resistance Ri of the AC potential difference detecting unit 521 is much higher than the wiring resistance Rw and the contact resistance Rc (Ri>>(Rw+Rc)). Thus, by adopting such a configuration, the measurement error err is expressed by the following equation (5) and becomes negligibly small, wherefore Vi=Vx can be assumed.

[Equation 5]

$$err = \frac{Vi}{Vx} = \frac{Ri}{Rc + Rw + Ri} \quad (5)$$

Figure 10:
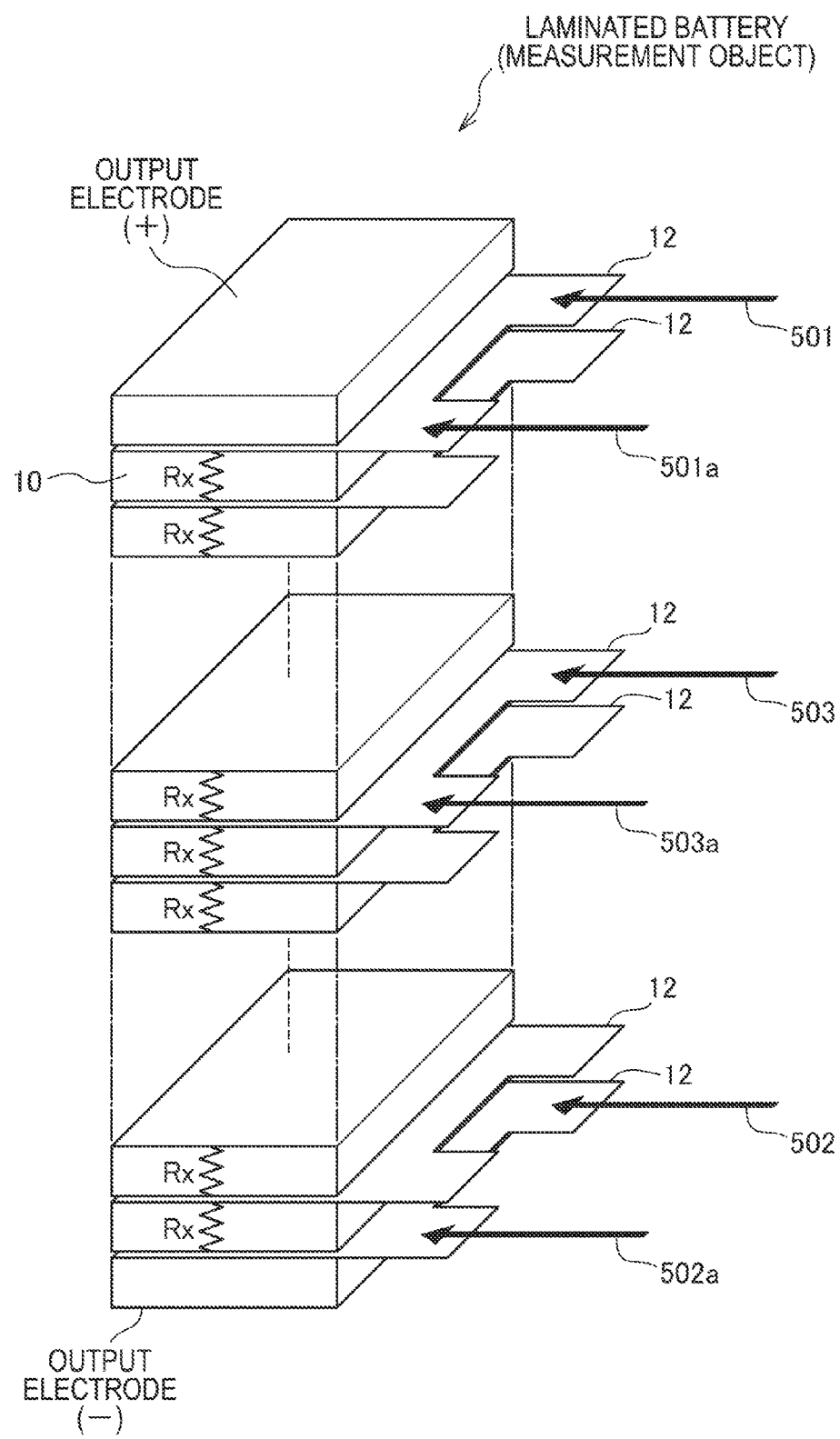
FIG. 10 is a diagram showing a specific configuration of the second embodiment.

FIG. 10 is a diagram showing a specific configuration of the second embodiment.

A connection part is provided by partially extending a separator (bipolar plate) 12 of a power generation cell 10 constituting a fuel battery 1.

Figure 11:
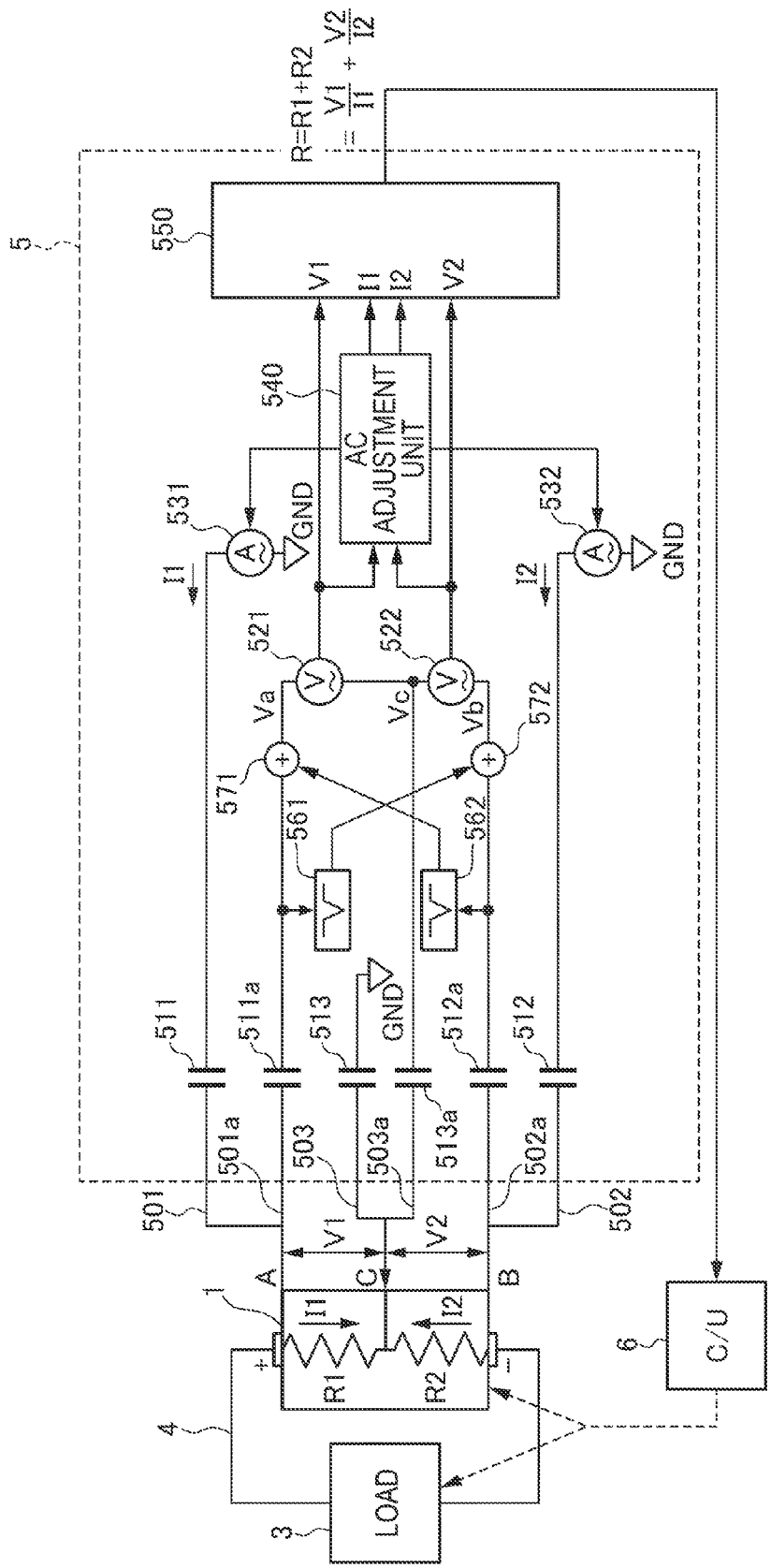
FIG. 11 is a circuit diagram of the second embodiment of the impedance measuring device for a laminated battery according to the present invention.

FIG. 11 is a circuit diagram showing the second embodiment of the impedance measuring device for a laminated battery according to the present embodiment.

A positive-electrode side AC potential difference detecting unit 521 is connected to a separator (bipolar plate) on a positive electrode side of the fuel battery 1 via a capacitor 511a. A positive-electrode side power supply unit 531 is connected to the same separator (bipolar plate) as the one connected to the positive-electrode side AC potential difference detecting unit 521 by a path 501 different from a path 501a of the positive-electrode side AC potential difference detecting unit 521.

A negative-electrode side AC potential difference detecting unit 522 is connected to a separator (bipolar plate) on a negative electrode side of the fuel battery 1 via a capacitor 512a. A negative-electrode side power supply unit 532 is connected to the same separator (bipolar plate) as the one connected to the negative-electrode side AC potential difference detecting unit 522 by a path 502 different from a path 502a of the negative-electrode side AC potential difference detecting unit 522.

A ground line 503 is connected to a separator (bipolar plate) at an intermediate point (point of an intermediate potential) of the fuel battery 1 via a capacitor 513. Further, the positive-electrode side AC potential difference detecting unit 521 and the negative-electrode side AC potential difference detecting unit 522 are connected to the same separator (bipolar plate) as the one connected to the ground line 503 by a path 503a different from that of the ground line 503 via a capacitor 513a.

Further, in the present embodiment, focusing on that a command signal of an AC adjustment unit 540 is in a proportional relationship with output signals of the positive-electrode side power supply unit 531 and the negative-electrode side power supply unit 532, alternating current values (I1, I2) are obtained based on this command signal.

According to the present embodiment, the influence of a resistance variation due to the magnitudes of the wiring resistance and the contact resistance, temperature, terminal surface oxidation or the like can be drastically reduced. Thus, a degree of freedom in designing a laminated battery side and signal wiring is high and an impedance of each laminated cell group can be inexpensively and accurately detected. Further, since it is not necessary to actually measure the alternating current values (I1, I2), the circuit can be simplified.

Also in such a circuit configuration, signals in which is noise is canceled out are output from a positive-electrode side adder 571 and a negative-electrode side adder 572 as in the first embodiment. Thus, the positive-electrode side AC potential difference detecting unit 521 and the negative-electrode side potential difference detecting unit 522 can detect AC potential differences free from noise.

Third Embodiment

Figure 12:
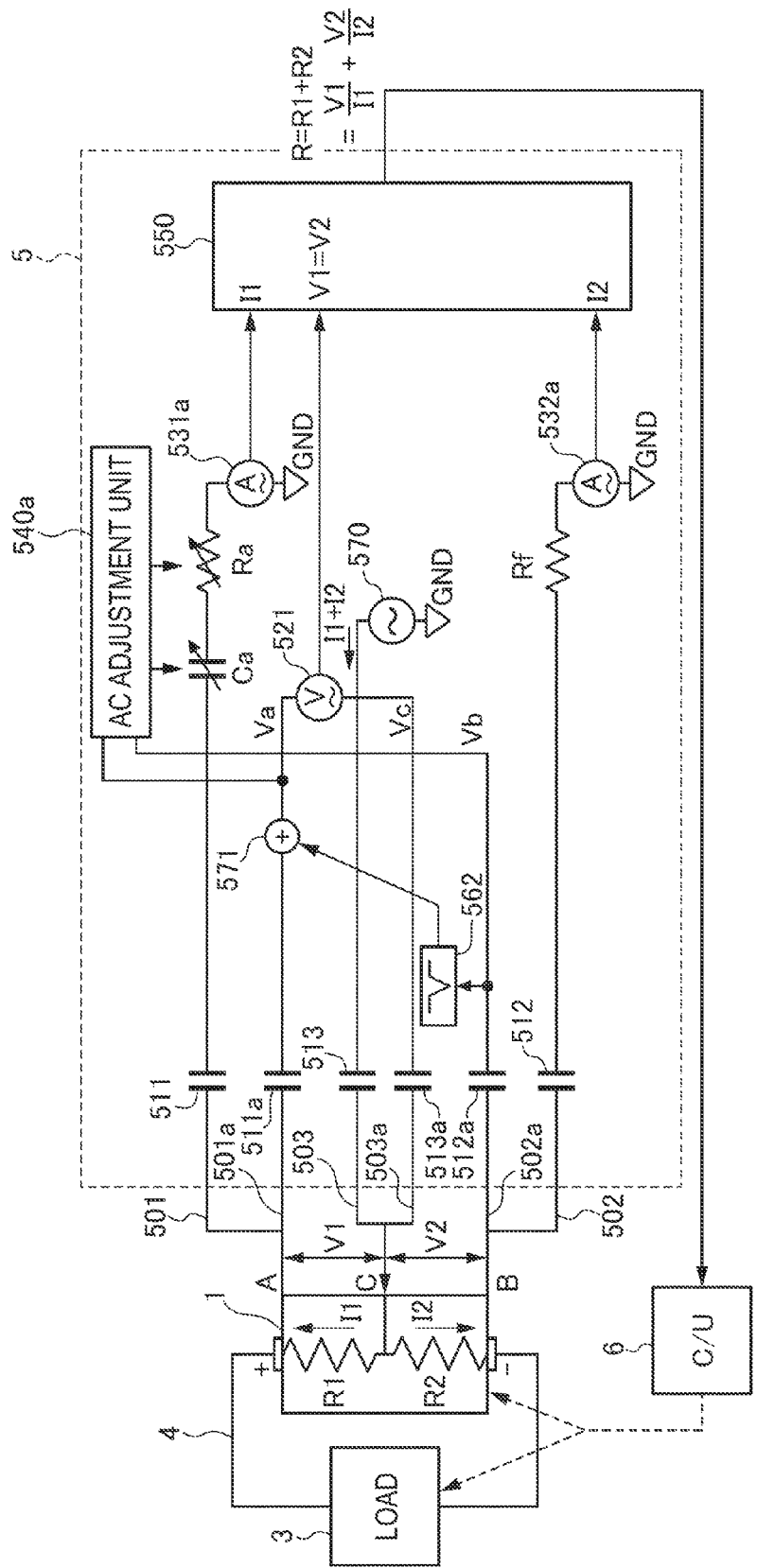
FIG. 12 is a circuit diagram of an impedance measuring device for a laminated battery in a third embodiment.

FIG. 12 is a circuit diagram of an impedance measuring device for a laminated battery in a third embodiment. In the present embodiment, an AC potential difference detecting unit is also provided only on a positive electrode side. Accordingly, an adder (571) is provided only on the positive electrode side and a notch filter (562) is provided only on a negative electrode side.

In the present embodiment, an AC power supply unit 570 is connected to a separator (bipolar plate) at an intermediate point (point of an intermediate potential) of a fuel battery 1 via a capacitor 513. Further, a positive-electrode side AC potential difference detecting unit 521 is connected to the same separator (bipolar plate) as the one connected to the AC power supply unit 570 by a path 503a different from a path 503 of the AC power supply unit 570 via a capacitor 513a.

A positive-electrode side AC detecting unit 531a is connected to the same separator (bipolar plate) as the one connected to the positive-electrode side AC potential difference detecting unit 521 by a path 501 different from a path 501a of the positive-electrode side AC potential difference detecting unit 521 via a capacitor 511.

A negative-electrode side AC detecting unit 532a is connected to the same separator (bipolar plate) as the one connected to a capacitor 512a by a path 502 different from a path 502a of the capacitor 512a via a fixed resistor Rf and a capacitor 512. It should be noted that current-voltage conversion circuits by OP amplifiers, AC sensors of a current transformer (CT) type or the like can be used as the AC detecting units 531a, 532a.

One end of an AC adjustment unit 540a is connected between the capacitor 511a and the positive-electrode side AC potential difference detecting unit 521. Further, the other end is connected to the capacitor 512a. This enables a positive-electrode side AC potential Va and a negative-electrode side AC potential Vb of the fuel battery 1 to be input to the AC adjustment unit 540a. Then, the AC adjustment unit 540a adjusts a variable resistor Ra and a variable capacitor Ca.

Figure 13:
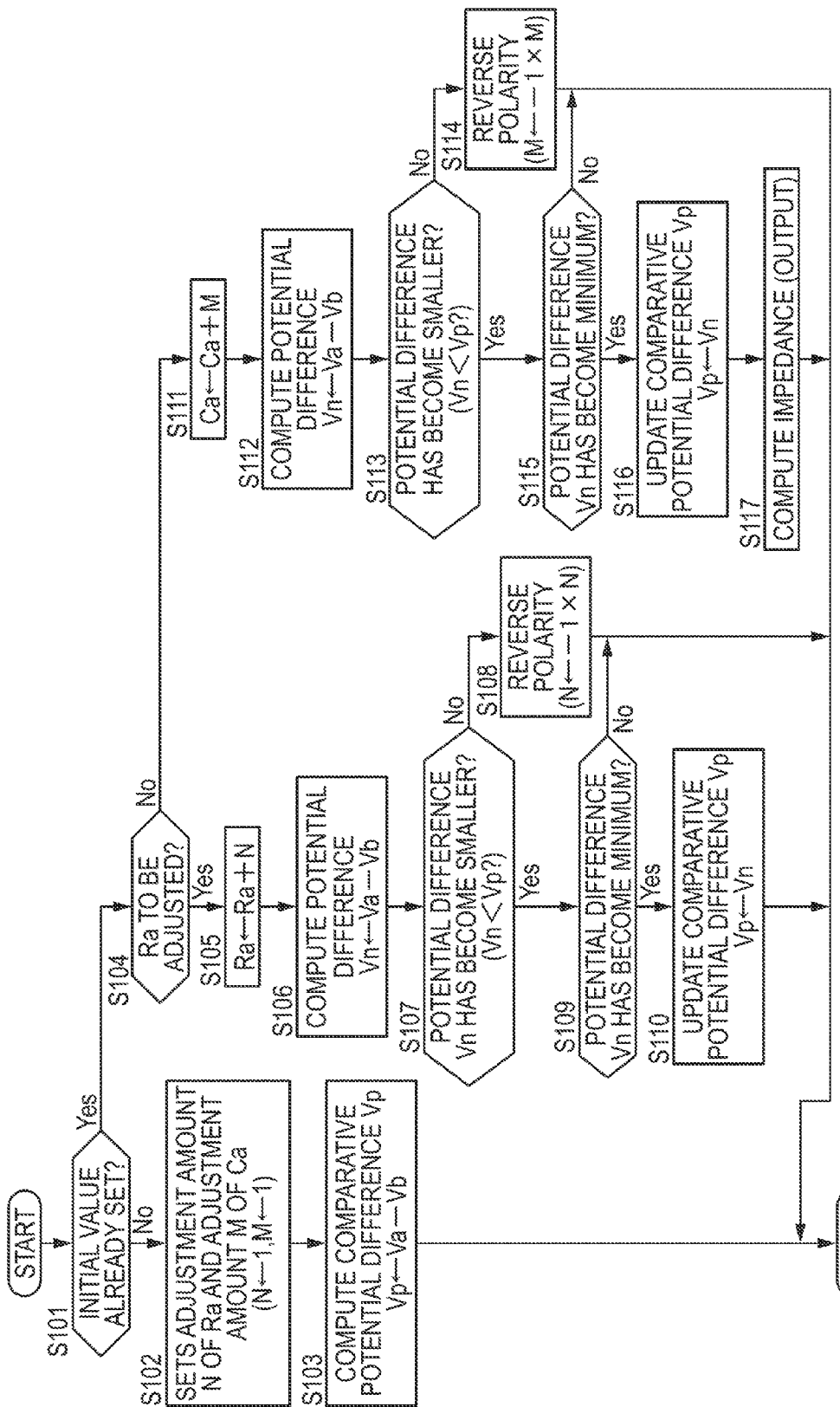
FIG. 13 is a control flow chart to be executed by a controller of the impedance measuring device for a laminated battery in the third embodiment.

FIG. 13 is a control flow chart to be executed by a controller of the impedance measuring device for a laminated battery in the third embodiment.

In Step S101, a control unit 6 determines whether or not initial values have been set. The control unit 6 proceeds to Step S102 if a determination result is negative (initial values have not been set yet) while proceeding to Step S104 if the determination result is affirmative (initial values have been set).

In Step S102, the control unit 6 sets an adjustment amount N of the variable resistor Ra and an adjustment amount M of the variable capacitor Ca. Here, each amount is set at 1 as an example.

In Step S103, the control unit 6 computes a comparative potential difference Vp by subtracting the negative-electrode side AC potential Vb from the positive-electrode side AC potential Va.

In Step S104, the control unit 6 determines whether or not to adjust the variable resistor Ra. The control unit 6 proceeds to Step S105 if a determination result is affirmative while proceeding to Step S111 if the determination result is negative.

In Step S105, the control unit 6 updates a variable resistance value Ra by adding the adjustment amount N to a resistance value Ra of the variable resistor.

In Step S106, the control unit 6 computes a potential difference Vn by subtracting the negative-electrode side AC potential Vb from the positive-electrode side AC potential Va.

In Step S107, the control unit 6 determines whether or not the potential difference Vn has become smaller than the comparative potential difference Vp. The control unit 6 proceeds to Step S108 if a determination result is negative while proceeding to Step S109 if the determination result is affirmative.

In Step S108, the control unit 6 reverses the polarity of the adjustment amount N and temporarily exits from the process.

In Step S109, the control unit 6 determines whether or not the potential difference Vn has become minimum. The control unit 6 proceeds to Step S110 if a determination result is affirmative while temporarily exiting from the process if the determination result is negative.

In Step S110, the control unit 6 updates the comparative potential difference Vp to the potential difference Vn at that point of time.

In Step S111, the control unit 6 updates a variable capacitor capacitance Ca by adding the adjustment amount M to the capacitance Ca of the variable capacitor.

In Step S112, the control unit 6 computes the potential difference Vn by subtracting the negative-electrode side AC potential Vb from the positive-electrode side AC potential Va.

In Step S113, the control unit 6 determines whether or not the potential difference Vn has become smaller than the comparative potential difference Vp. The control unit 6 proceeds to Step S114 if a determination result is negative while proceeding to Step S115 if the determination result is affirmative.

In Step S114, the control unit 6 reverses the polarity of the adjustment amount M and temporarily exits from the process.

In Step S115, the control unit 6 determines whether or not the potential difference Vn has become minimum. The control unit 6 proceeds to Step S116 if a determination result is affirmative while temporarily exiting from the process if the determination result is negative.

In Step S116, the control unit 6 updates the comparative potential difference Vp to the potential difference Vn at that point of time.

In Step S117, the control unit 6 computes impedances in accordance with the aforementioned equations (1-1), (1-2).

When the above flow chart is executed, the impedance measuring device operates as follows.

First, the initial values are set (S101→S102→S103).

In the next cycle, the variable resistor Ra is first adjusted. The variable resistance value Ra is adjusted (S105), the potential difference Vn is computed (S106), the polarity of the adjustment amount N is reversed (S108) unless the potential difference becomes smaller and it is determined whether or not the potential difference has a minimum value (S109) if the potential difference has become smaller. By repeating a similar process (S101→S104→S105→S106→S107→S108 or S109) until the potential difference becomes the minimum value, the variable resistance value Ra is adjusted to the minimum value. When the variable resistance value Ra is adjusted to the minimum value, the comparative potential difference Vp is updated to the potential difference Vn at that point of time (S110).

In the next cycle, the variable capacitor capacitance Ca is adjusted. The variable capacitor capacitance Ca is adjusted (S111), the potential difference Vn is computed (S112), the polarity of the adjustment amount M is reversed (S114) unless the potential difference becomes smaller and it is determined whether or not the potential difference has a minimum value (S115) if the potential difference has become smaller. By repeating a similar process (S101→S104→S111→S112→S113→S114 or S115) until the potential difference becomes the minimum value, the variable capacitor capacitance Ca is adjusted to the minimum value. When the variable capacitor capacitance Ca is adjusted to the minimum value, the comparative potential difference Vp is updated to the potential difference Vn at that point of time (S116).

Then, impedances are computed in accordance with the aforementioned equations (1-1), (1-2) (S117).

If the present embodiment is adopted, AC voltage amplitudes at opposite ends of each laminated cell group inevitably become equal. Thus, effects similar to those of the first and second embodiments are obtained. Specifically, since the value of the alternating current flowing in the impedance measurement object (fuel battery) and the value of the alternating current output from the power supply coincide, the alternating current flowing into the measurement object can be accurately detected. Since the impedance of the laminated battery is computed based on this alternating current, the impedance of the laminated battery in operation can be accurately measured without being affected by a state of a load device.

Further, according to the present embodiment, since the AC voltage amplitudes at the opposite ends of each laminated cell group inevitably become equal, it is sufficient to provide the AC potential difference detecting unit on either one of the positive electrode side and the negative electrode side. It should be noted that, in the present embodiment, the AC potential difference detecting unit 521 is provided on the positive electrode side. Thus, the circuit can be simplified.

Also in the present embodiment, a signal in which noise is canceled out is output from the positive-electrode side adder 571 as in the first embodiment. Thus, the positive-electrode side AC potential difference detecting unit 521 can detect an AC potential difference free from noise.

Fourth Embodiment

Figure 14:
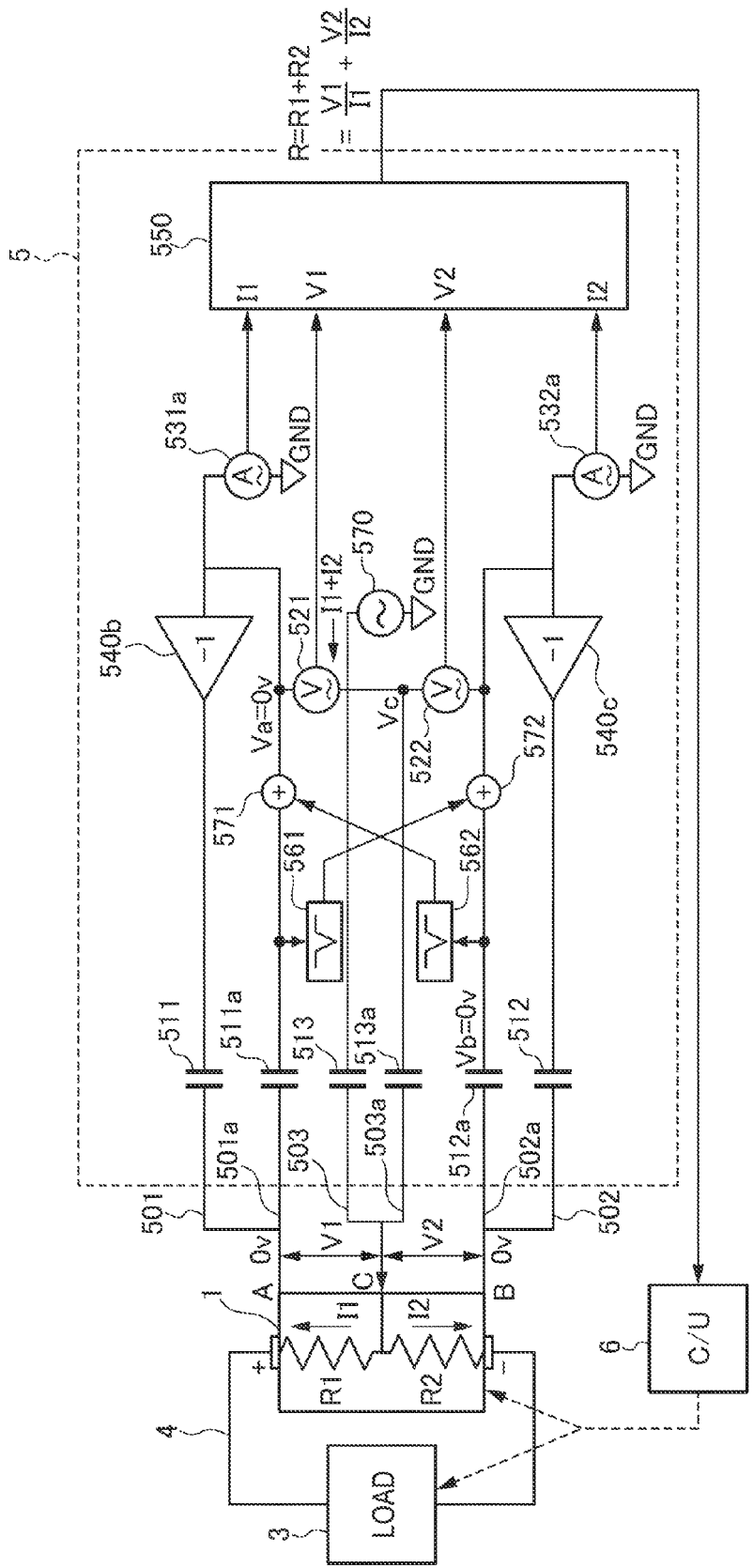
FIG. 14 is a circuit diagram of an impedance measuring device for a laminated battery in a fourth embodiment.

FIG. 14 is a circuit diagram of an impedance measuring device for a laminated battery in a fourth embodiment.

In the present embodiment, as in the third embodiment, an AC power supply unit 570 is connected to a separator (bipolar plate) at an intermediate point of a fuel battery 1 via a capacitor 513. Further, a positive-electrode side AC potential difference detecting unit 521 and a negative-electrode side AC potential difference detecting unit 522 are connected to the same separator (bipolar plate) as the one connected to the AC power supply unit 570 by a path 503a different from a path 503 of the AC power supply unit 570 via a capacitor 513a.

A positive-electrode side AC polarity reversing amplifier 540b is connected to the same separator (bipolar plate) as the one connected to the positive-electrode side AC potential difference detecting unit 521 by a path 501 different from a path 501a of the positive-electrode side AC polarity reversing amplifier 521 via a capacitor 511.

A negative-electrode side AC polarity reversing amplifier 540c is connected to the same separator (bipolar plate) as the one connected to the negative-electrode side AC potential difference detecting unit 522 by a path 502 different from a path 502a of the negative-electrode side AC polarity reversing amplifier 522 via a capacitor 512. It should be noted that reversion amplifying circuits, boot strap circuits, active noise canceling circuits or the like can be applied as the polarity reversing amplifiers 540b, 540c.

If such a configuration is adopted, the polarity of an AC voltage detected at a laminated battery output end is reversed and returned to each laminated battery output terminal. Thus, an AC voltage amplitude at the laminated battery output end is forcibly canceled (zeroed). This causes the AC voltage amplitudes at the opposite ends of the laminated battery to both become zero and have an equal potential.

Further, the alternating current flowing in each laminated cell group is detected by the AC detecting units 531a, 532a and AC voltages at the opposite ends of the laminated cell groups are detected by the AC potential difference detecting units 521, 522 connected to an AC voltage detection line.

Thus, according to the present embodiment, a voltage comparison function by the AC adjustment unit 540 is unnecessary, wherefore the circuit can be simplified.

Also in the present embodiment, signals in which noise is canceled out are output from the positive-electrode side adder 571 and the negative-electrode side adder 572 as in the first embodiment, wherefore the positive-electrode side AC potential difference detecting unit 521 and the negative-electrode side AC potential difference detecting unit 522 can detect AC potential differences free from noise.

Fifth Embodiment

Figure 15:
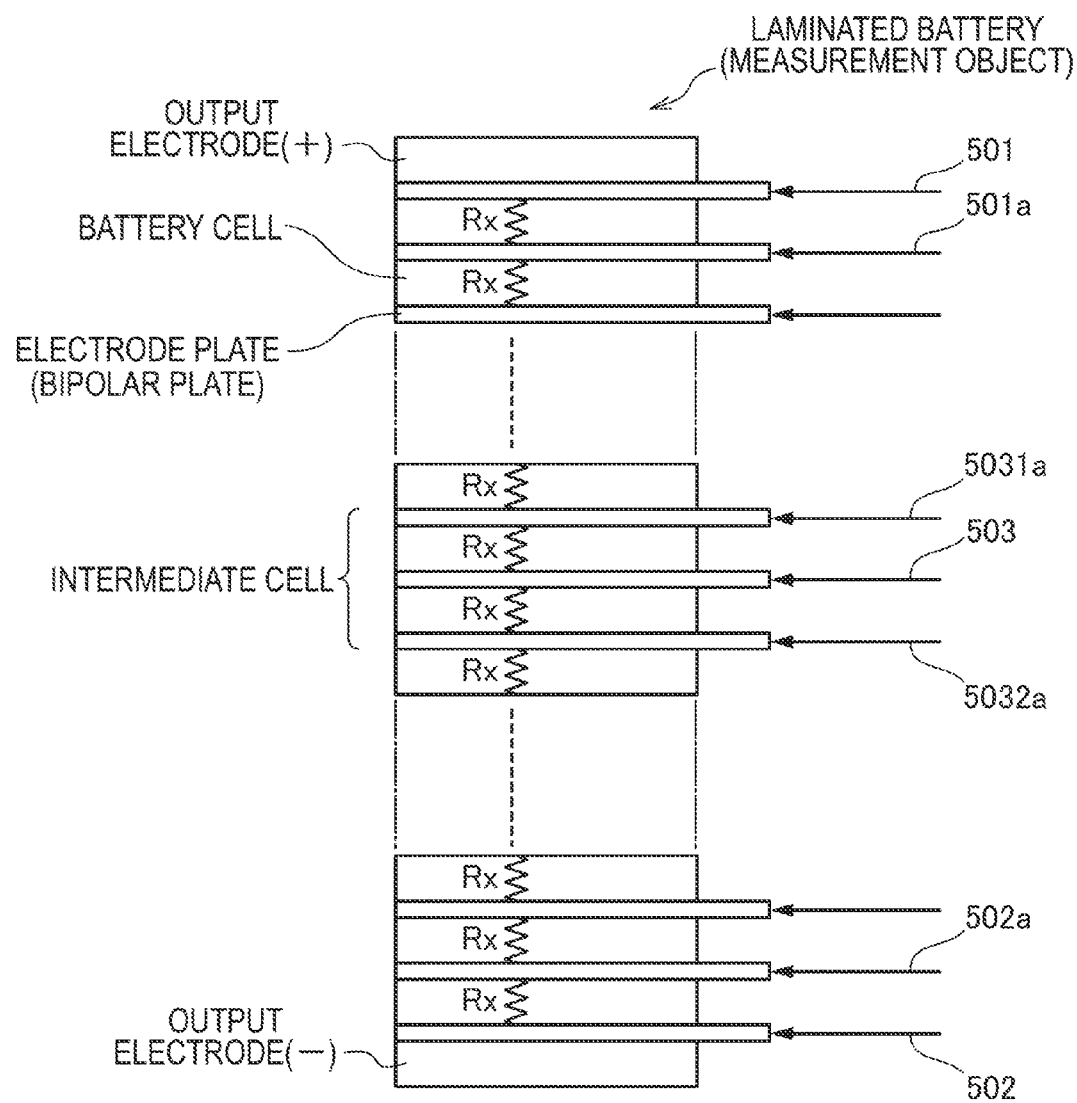
FIG. 15 is a diagram showing a fifth embodiment of the impedance measuring device for a laminated battery according to the present invention.

FIG. 15 is a circuit diagram of an impedance measuring device for a laminated battery in a fifth embodiment.

Figure 16:
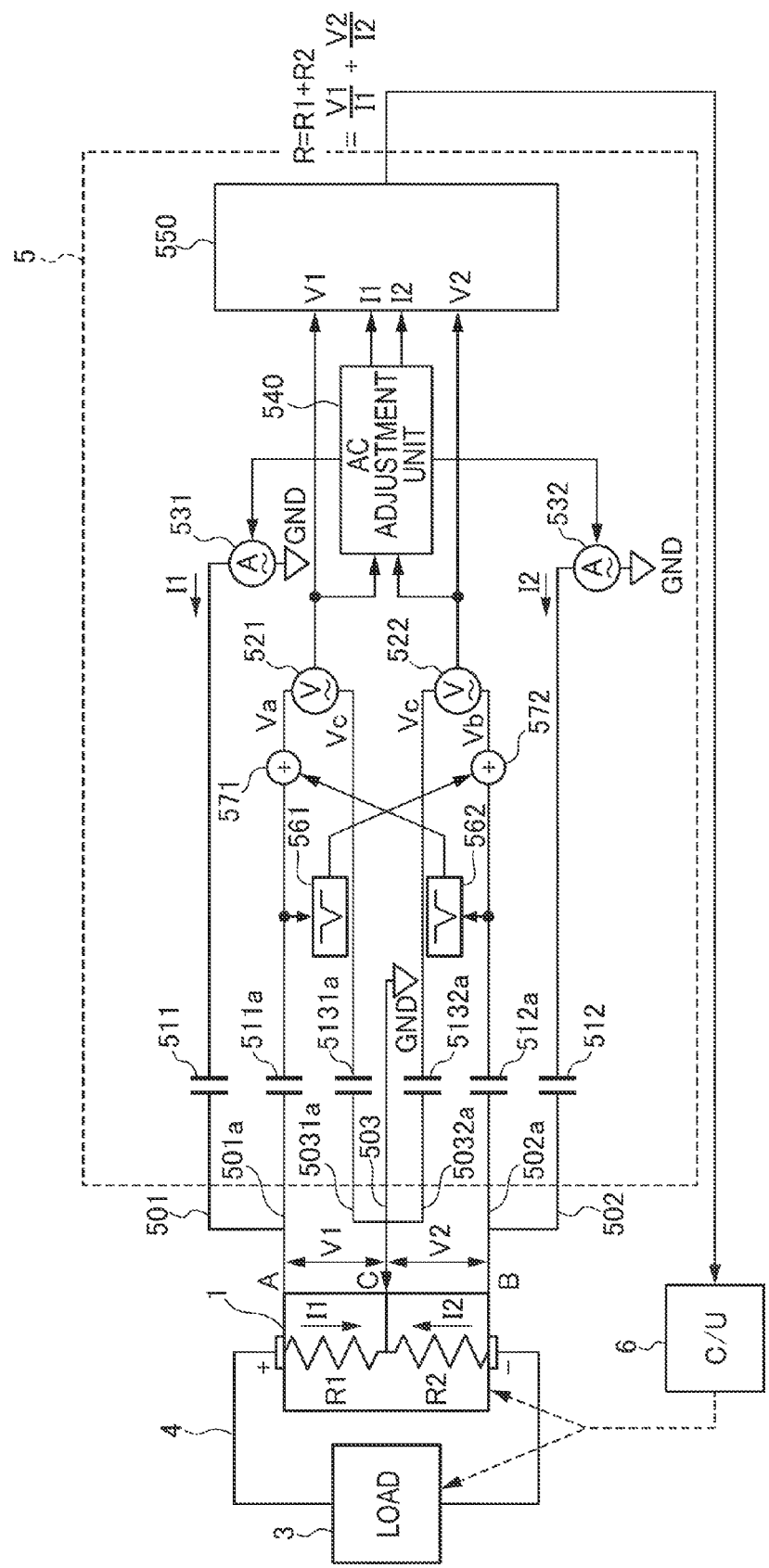
FIG. 16 is a specific circuit diagram of the fifth embodiment.

In each of the above embodiments, the AC potential difference detecting unit and the power supply unit (or AC detecting unit) are connected to the common separator (bipolar plate). Contrary to this, in the present embodiment, they are connected to different bipolar plates separated with at least one bipolar plate located therebetween. A specific circuit diagram is shown in FIG. 16.

A positive-electrode side power supply unit 531 is connected to a bipolar plate 501 on a positive electrode side of a fuel battery 1 via a capacitor 511. A positive-electrode side AC potential difference detecting unit 521 is connected to a bipolar plate 501a different from the bipolar plate 501 via a capacitor 511a. Further, the positive-electrode side AC potential difference detecting unit 521 is connected to a bipolar plate 5031a different from a bipolar plate 503 connected to a ground line via a capacitor 5131a.

A negative-electrode side power supply unit 532 is connected to a bipolar plate 502 on a negative electrode side of the fuel battery 1 via a capacitor 512. A negative-electrode side AC potential difference detecting unit 522 is connected to a bipolar plate 502a different from the bipolar plate 502 via a capacitor 512a. Further, the negative-electrode side AC potential difference detecting unit 522 is connected to a bipolar plate 5032a different from the bipolar plate 503 connected to the ground line via a capacitor 5132a.

Also according to the present embodiment, functions and effects similar to those of the second embodiment are obtained. Miniaturization is possible since a space taken up by connection terminals can be narrowed. It should be noted that, in the case of the present embodiment, a cell impedance between the bipolar plates 501 and 501a, that between the bipolar plates 502 and 502a, that between the bipolar plates 503 and 5031a and that between the bipolar plates 503 and 5032a are all outside an AC voltage detection range and cannot be detected. However, if a large number of cells are laminated such as in a large-side laminated battery or if impedances among the cells are aligned in variations, there is no problem since an average cell impedance per cell can be computed and corrected from the number of the cells in the detection range.

Also in the present embodiment, signals in which noise is canceled out are output from the positive-electrode side adder 571 and the negative-electrode side adder 572 as in the first embodiment, wherefore the positive-electrode side AC potential difference detecting unit 521 and the negative-electrode side AC potential difference detecting unit 522 can detect AC potential differences free from noise.

Sixth Embodiment

Figure 17:
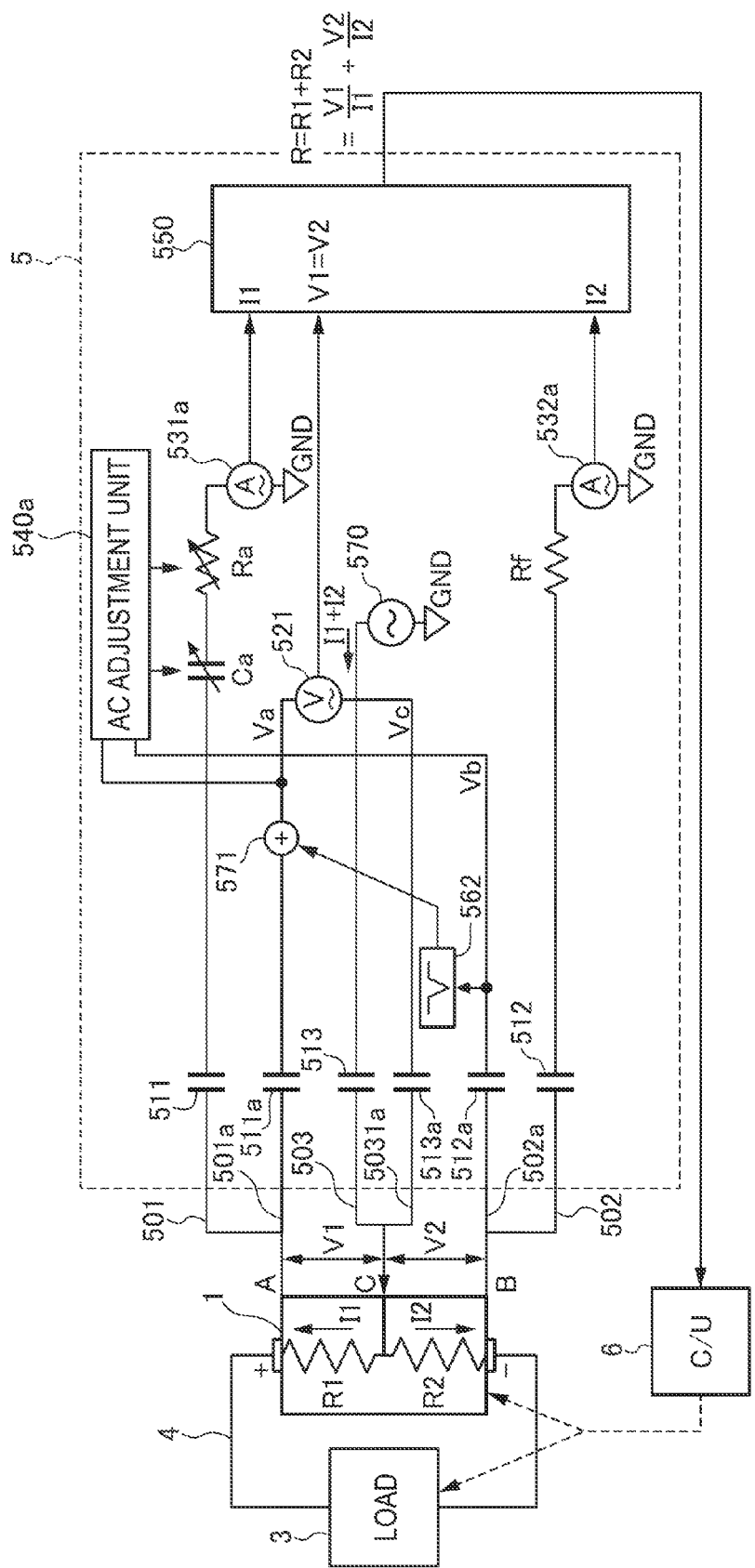
FIG. 17 is a circuit diagram of an impedance measuring device for a laminated battery in a sixth embodiment.

FIG. 17 is a circuit diagram of an impedance measuring device for a laminated battery in a sixth embodiment.

If the present embodiment is shown in a circuit diagram, the same one as in the third embodiment (FIG. 12) is obtained. Although the AC potential difference detecting unit and the power supply unit (or AC detecting unit) are connected to the common separator (bipolar plate) in the third embodiment, they are connected to different bipolar plates separated with at least one bipolar plate located therebetween in the present embodiment. It should be noted that, in the present embodiment, the AC potential difference detecting unit is provided only on a positive electrode side and connected to the bipolar plate 5031a of FIG. 15. The AC potential difference detecting unit connected to the bipolar plate 5032a of FIG. 15 is unnecessary.

By doing so, AC voltage amplitudes at opposite ends of each laminated cell group inevitably become equal as in the third embodiment. Thus, the value of an alternating current flowing in an impedance measurement object (fuel battery) and the value of an alternating current output from a power supply coincide, wherefore the alternating current flowing into the measurement object can be accurately detected. Since the impedance of the laminated battery is computed based on this alternating current, the impedance of the laminated battery in operation can be accurately measured without being affected by a state of a load device. Further, miniaturization is possible since a space taken up by connection terminals can be narrowed.

Also in the present embodiment, signals in which noise is canceled out are output from the positive-electrode side adder 571 as in the first embodiment, wherefore the positive-electrode side AC potential difference detecting unit 521 can detect an AC potential difference free from noise.

Seventh Embodiment

Figure 18:
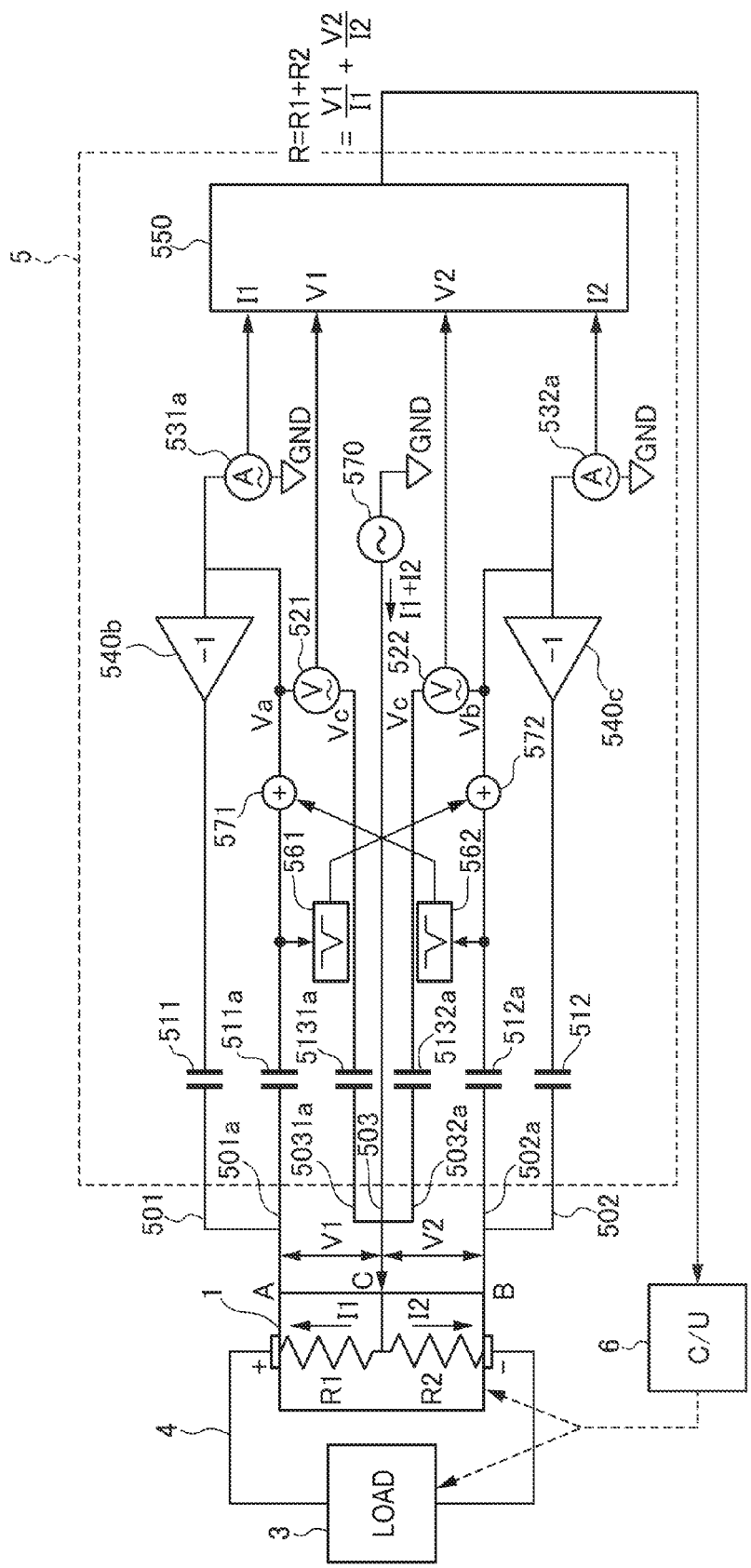
FIG. 18 is a circuit diagram of an impedance measuring device for a laminated battery in a seventh embodiment.

FIG. 18 is a circuit diagram of an impedance measuring device for a laminated battery in a seventh embodiment.

The present embodiment is basically the same as the fourth embodiment (FIG. 14). However, the AC potential difference detecting unit and the power supply unit (or AC detecting unit) are connected to the common separator (bipolar plate) in the fourth embodiment (FIG. 14), whereas they are connected to different bipolar plates separated with at least one bipolar plate located therebetween in the present embodiment.

A positive-electrode side AC polarity reversing amplifier 540b is connected to a bipolar plate 501 on a positive electrode side of a fuel battery 1 via a capacitor 511. A positive-electrode side AC potential difference detecting unit 521 is connected to a bipolar plate 501a different from the bipolar plate 501 via a capacitor 511a. Further, the positive-electrode side potential difference detecting unit 521 is connected to a bipolar plate 5031a different from a bipolar plate 503 connected to a ground line via a capacitor 5131a.

A negative-electrode side AC polarity reversing amplifier 540c is connected to a bipolar plate 502 on a negative electrode side of the fuel battery 1 via a capacitor 512. A negative-electrode side AC potential difference detecting unit 522 is connected to a bipolar plate 502a different from the bipolar plate 502 via a capacitor 512a. Further, the negative-electrode side potential difference detecting unit 522 is connected to a bipolar plate 5032a different from the bipolar plate 503 connected to the ground line via a capacitor 5132a.

By doing so, the polarity of an AC voltage detected at a laminated battery output end is reversed and returned to each laminated battery output terminal as in the fourth embodiment. Thus, an AC voltage amplitude at the laminated battery output end is forcibly canceled (zeroed). This causes the AC voltage amplitudes at the opposite ends of the laminated battery to both become zero and have an equal potential. Further, the alternating current flowing in each laminated cell group is detected by the AC detecting units 531a, 532a and AC voltages at the opposite ends of the laminated cell groups are detected by the AC potential difference detecting units 521, 522 connected to an AC voltage detection line. Thus, according to the present embodiment, a voltage comparison function by the AC adjustment unit 540 is unnecessary, wherefore the circuit can be simplified. Further, miniaturization is possible since a space taken up by connection terminals can be narrowed.

Also in the present embodiment, signals in which noise is canceled out are output from the positive-electrode side adder 571 and the negative-electrode side adder 572 as in the first embodiment, wherefore the positive-electrode side AC potential difference detecting unit 521 and the negative-electrode side AC potential difference detecting unit 522 can detect AC potential differences free from noise.

Reference Embodiment

The intermediate point is the point of the intermediate potential of the fuel battery 1 in each of the above embodiments. A configuration for providing a notch filter in a circuit when the intermediate point is not the point of the intermediate potential of the fuel battery 1 is considered.

For example, if a point dividing a distance between the positive electrode terminal and the negative electrode terminal of the fuel battery 1 at 1:2 is an intermediate point and grounded, the positive-electrode side AC potential difference detecting unit detects a signal which is ⅓ of an AC potential difference signal containing noise and the negative-electrode side potential difference detecting unit detects a signal which is ⅔ of the AC potential difference signal containing noise. Thus, if the signal detected by the positive-electrode side AC potential difference detecting unit is amplified two-fold, signal levels detected by the positive-electrode side AC potential difference detecting unit and the negative-electrode side AC potential difference detecting unit become equal. By causing the signals adjusted to have the same signal level to pass through the notch filters and the adders as described in each of the above embodiments, noise can be canceled.

Figure 19:
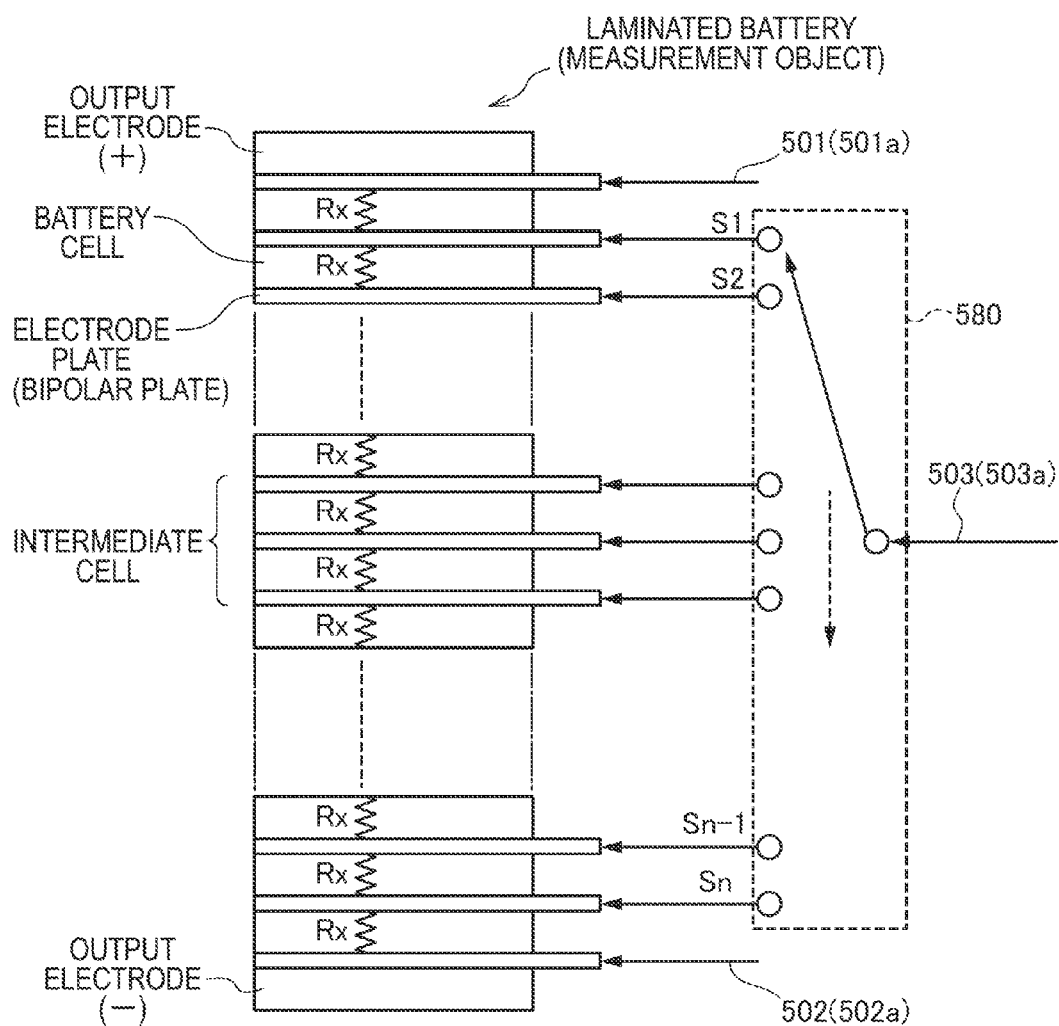
FIG. 19 is a diagram showing a configuration for successively switching intermediate points in a connection switcher 580.
Figure 20:
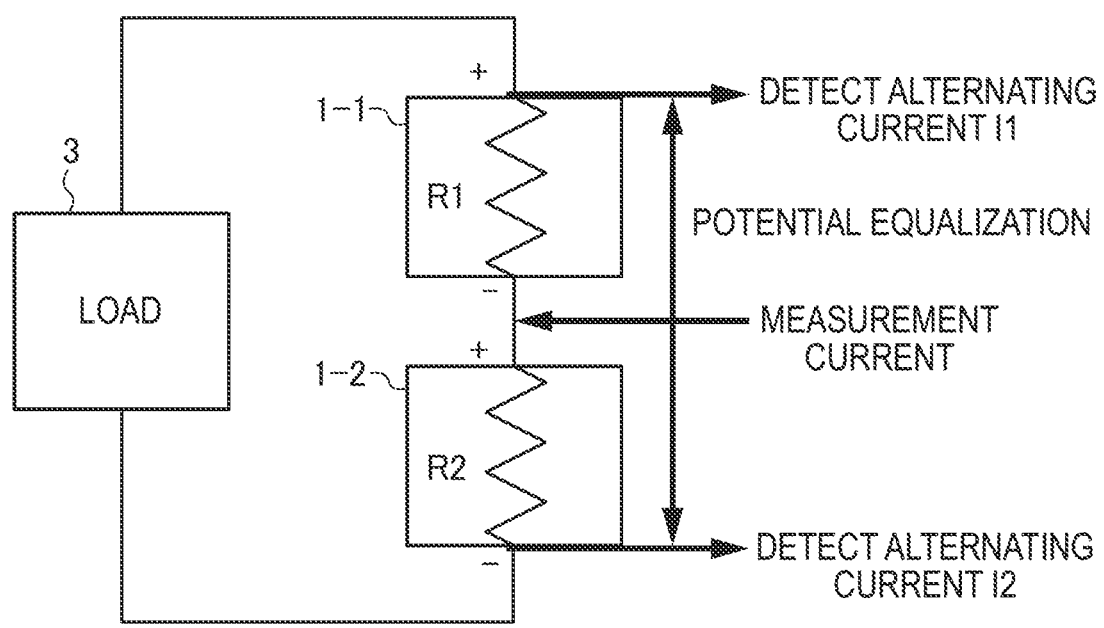
FIG. 20 is a diagram showing a modification.

FIG. 19 is a configuration diagram for successively switching intermediate points in a connection switcher 580. Also in this case, noise can be canceled by causing signals to pass through the notch filters and the adders after signal levels detected by the positive-electrode side AC potential difference detecting unit and the negative-electrode side AC potential difference detecting unit are adjusted to be equal according to the position of the intermediate point to be switched.

According to this configuration for switching the intermediate points, an impedance of a currently connected cell can be computed by comparing the current measurement value and the last measurement value. Thus, an impedance can be measured for each cell. In this way, an impedance distribution in a lamination direction and local degradation of the cells can be monitored.

Although the embodiments of the present invention have been described above, the above embodiments are merely some application examples of the present invention and not of the nature to limit the technical scope of the present invention to the specific configurations of the above embodiments.

For example, serially connected laminated battery 1-1 and laminated battery 1-2 may be an impedance measurement object. In such a case, a positive electrode side of the laminated battery 1-1 is regarded as the positive electrode side of the above embodiments, an intermediate point between the laminated batteries 1-1 and 1-2 is regarded as the intermediate point of the above embodiments and a negative electrode side of the laminated battery 1-2 is regarded as the negative electrode side of the above embodiments. The intermediate point is a point of an intermediate potential of the impedance measurement object including the laminated batteries 1-1, 1-2. By doing so, an impedance value of the laminated battery 1-1 is obtained as R1 and that of the laminated battery 1-2 is obtained as R2. Also in this way, the impedance value of each of the laminated batteries 1-1, 1-2 can be accurately obtained without being affected by noise by providing notch filters and adders as in each of the above embodiments.

Further, although the fuel battery is cited as an example of the laminated battery in the above description, the laminated battery may be a battery such as a lithium ion battery. Specifically, application is possible to any battery provided that a plurality of power generation elements are laminated. Even in such a battery, efficient operation is possible if an internal resistance can be measured, which is desirable.

Although the configuration with the AC adjustment unit (540, 540*a*) has been described in the above first to third, fifth and sixth embodiments, it is also possible to omit the AC adjustment unit (540, 540*a*) since the intermediate point is the point of the intermediate potential of the fuel battery 1.

Although the intermediate point is the point of the intermediate potential of the fuel battery 1, it may be not a point of a perfectly intermediate potential, but a point close to the intermediate potential.

The present application claims a priority of Japanese Patent Application No. 2012-224266 filed with the Japan Patent Office on Oct. 9, 2012, all the contents of which are hereby incorporated by reference.

The invention claimed is:

1. An impedance measuring device for a laminated battery, comprising:
    an AC power supply unit configured to output an alternating current to an impedance measured object, the impedance measured object including at least a laminated battery;
    an AC potential difference detecting unit configured to detect at least one of a positive-electrode side AC potential difference or a negative-electrode side AC potential difference, the positive-electrode side AC potential difference being a potential difference between a potential on a positive electrode side of the impedance measured object and an intermediate potential of the impedance measured object, the negative-electrode side AC potential difference being a potential difference between a potential on a negative electrode side of the impedance measured object and an intermediate potential of the impedance measured object;
    an impedance computing unit configured to compute an impedance of the laminated battery on the basis of the at least one AC potential difference and the alternating current applied to the impedance measured object;
    a filter configured to remove a signal with a measurement frequency of an AC signal from the AC signal having a measurement component at the measurement frequency, the AC signal indicating the AC potential difference on one electrode side opposite to that of the AC potential difference used by the impedance computing unit; and
    an adding unit configured to add a filtered signal to the AC signal, the filtered signal being a signal after passing through the filter, the AC signal indicating the AC potential difference used by the impedance computing unit.

2. The impedance measuring device for a laminated battery according to claim 1, wherein:
    the filter is a notch filter.

3. An impedance measuring device for a laminated battery, comprising:
    an AC power supply unit configured to output an alternating current to an impedance measured object, the impedance measured object including at least a laminated battery;
    an AC potential difference detecting unit configured to detect at least one of a positive-electrode side AC potential difference and a negative-electrode side AC potential difference, the positive-electrode side AC potential difference being a potential difference between a potential on a positive electrode side of the impedance measured object and an intermediate potential of the impedance measured object, the negative-electrode side AC potential difference being a potential difference between a potential on a negative electrode side of the impedance measured object and an intermediate potential of the impedance measured object;
    an impedance computing unit configured to compute an impedance of the laminated battery on the basis of the at least one AC potential difference and the alternating current applied to the impedance measured object;
    a first filter configured to remove a signal with a measurement frequency of an AC signal from the AC signal having a measurement component at the measurement frequency, the AC signal indicating the positive-electrode side AC potential difference;
    a second filter configured to remove a signal with the measurement frequency of an AC signal from the AC signal having a measurement component at the measurement frequency, the AC signal indicating the negative-electrode side AC potential difference;
    a first adding unit configured to add a filtered signal to the AC signal, the filtered signal being a signal after passing through the first filter, the AC signal indicating the negative-electrode side AC potential difference; and
    a second adding unit configured to add a filtered signal to the AC signal, the filtered signal being a signal after passing through the second filter, the AC signal indicating the positive-electrode side AC potential difference.

\* \* \* \* \*